(12) United States Patent
Rehder

(10) Patent No.: US 11,496,089 B2
(45) Date of Patent: Nov. 8, 2022

(54) STACKED SOLAR ARRAY

(71) Applicant: The Boeing Company, Chicago, IL (US)

(72) Inventor: Eric M. Rehder, Los Angeles, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 16/847,359

(22) Filed: Apr. 13, 2020

(65) Prior Publication Data

US 2021/0320619 A1   Oct. 14, 2021

(51) Int. Cl.
*H02S 20/30*  (2014.01)
*H02S 30/10*  (2014.01)
*H02S 40/42*  (2014.01)

(52) U.S. Cl.
CPC .............. *H02S 30/10* (2014.12); *H02S 40/42* (2014.12)

(58) Field of Classification Search
CPC ....... H01L 31/00–078; Y02E 10/50–60; H02S 20/00–32; H02S 30/00–20; B64G 1/44–446
USPC ...................... 136/243–265; 244/172.7–172.8
See application file for complete search history.

(56) References Cited

U.S. PATENT DOCUMENTS

| | | |
|---|---|---|
| 4,101,101 A | 7/1978 | Barkats et al. |
| 4,257,821 A | 3/1981 | Kelly et al. |
| 4,481,378 A | 11/1984 | Lesk |
| 4,755,231 A | 7/1988 | Kurland et al. |
| 5,330,583 A | 7/1994 | Asai et al. |
| 5,567,248 A | 10/1996 | Chung |
| 6,008,448 A * | 12/1999 | Peck ...................... B64G 1/222 244/172.7 |
| 6,313,396 B1 | 11/2001 | Glenn |
| 6,441,297 B1 | 8/2002 | Keller et al. |
| 6,555,739 B2 | 4/2003 | Kawam |
| 6,637,702 B1 * | 10/2003 | McCandless ........... H02S 30/20 244/172.6 |

(Continued)

FOREIGN PATENT DOCUMENTS

| | | |
|---|---|---|
| CN | 203277428 U | 11/2013 |
| CN | 104443439 A | 3/2015 |

(Continued)

OTHER PUBLICATIONS

JP2003318433 English translation (Year: 2003).*

(Continued)

*Primary Examiner* — Bach T Dinh
(74) *Attorney, Agent, or Firm* — Gates & Cooper LLP

(57) ABSTRACT

At least first and second solar panels are provided, wherein: each of the first and second solar panels is comprised of a substrate having one or more solar cells bonded thereto, and a frame for supporting the substrate and the solar cells; the frame has a cutout or opening in a center of the frame under the solar cells and, when deployed, the cutout or opening enables cooling of the solar cells through the substrate by exposing a back side of the substrate for transferring or radiating heat directly through the cutout or opening of the frame; and the frame of the first solar panel is configured to be nested inside the cutout or opening of the frame of the second solar panel when the first and second solar panels are stowed in a stacked configuration.

23 Claims, 24 Drawing Sheets

(56) References Cited

U.S. PATENT DOCUMENTS

| | | | |
|---|---|---|---|
| 8,814,099 B1* | 8/2014 | Harvey | B64G 1/44 244/172.6 |
| 9,120,583 B1* | 9/2015 | Spence | B64G 1/222 |
| 9,758,261 B1 | 9/2017 | Steinfeldt | |
| 10,189,582 B1 | 1/2019 | Spence et al. | |
| 2004/0118446 A1 | 6/2004 | Toyomura | |
| 2008/0295889 A1 | 12/2008 | Schindler et al. | |
| 2009/0183760 A1 | 7/2009 | Meyer | |
| 2009/0255571 A1 | 10/2009 | Xia et al. | |
| 2009/0272436 A1 | 11/2009 | Cheung | |
| 2010/0000592 A1* | 1/2010 | Ko | H02S 20/00 136/246 |
| 2010/0012172 A1 | 1/2010 | Meakin et al. | |
| 2010/0089435 A1 | 4/2010 | Lockenhoff | |
| 2010/0186795 A1 | 7/2010 | Gaul | |
| 2011/0041890 A1 | 2/2011 | Sheats | |
| 2011/0073163 A1 | 3/2011 | Cheung | |
| 2011/0079263 A1 | 4/2011 | Avrutsky | |
| 2011/0168238 A1 | 7/2011 | Metin et al. | |
| 2011/0198444 A1 | 8/2011 | Dong | |
| 2011/0210209 A1 | 9/2011 | Taylor et al. | |
| 2012/0024350 A1* | 2/2012 | Chan | H02S 30/10 136/251 |
| 2012/0103388 A1 | 5/2012 | Meakin et al. | |
| 2012/0161801 A1 | 6/2012 | Hasegawa | |
| 2012/0199176 A1* | 8/2012 | Hong | H01L 31/052 136/246 |
| 2012/0313455 A1 | 12/2012 | Latham | |
| 2013/0014802 A1 | 1/2013 | Zimmerman | |
| 2013/0056047 A1 | 3/2013 | Beck et al. | |
| 2014/0000682 A1 | 1/2014 | Zhao | |
| 2014/0033625 A1 | 2/2014 | Jenkins et al. | |
| 2014/0166067 A1 | 6/2014 | McGlynn et al. | |
| 2014/0255780 A1 | 9/2014 | Mikhaylik et al. | |
| 2014/0366927 A1 | 12/2014 | Lavrova et al. | |
| 2015/0083191 A1 | 3/2015 | Gmundner | |
| 2015/0096607 A1 | 4/2015 | Yong | |
| 2015/0349703 A1 | 12/2015 | Morad et al. | |
| 2016/0197207 A1 | 7/2016 | Morioka et al. | |
| 2016/0218665 A1 | 7/2016 | Crist | |
| 2017/0040933 A1 | 2/2017 | Vogel | |
| 2017/0054406 A1 | 2/2017 | Narla et al. | |
| 2017/0098736 A1 | 4/2017 | Lee et al. | |
| 2017/0229692 A1* | 8/2017 | Thiel | A41D 31/265 |
| 2017/0374737 A1 | 12/2017 | Jeong et al. | |
| 2019/0127089 A1 | 5/2019 | Tomoda et al. | |
| 2019/0140584 A1 | 5/2019 | Hayashi et al. | |
| 2019/0305719 A1 | 10/2019 | Rehder | |
| 2019/0305723 A1 | 10/2019 | Rehder | |

FOREIGN PATENT DOCUMENTS

| | | |
|---|---|---|
| DE | 10136442 | 2/2003 |
| DE | 10136442 A1 | 2/2003 |
| EP | 3562032 A1 | 10/2019 |
| JP | 2002190612 | 7/2002 |
| JP | 2003318433 * | 11/2003 |
| JP | 2011071214 | 4/2011 |

OTHER PUBLICATIONS

Non-Final Office Action dated Dec. 7, 2020 for U.S. Appl. No. 15/787,304.
Final Office Action dated Jun. 1, 2021 for U.S. Appl. No. 15/643,277.
Final Office Action dated Mar. 12, 2021 for U.S. Appl. No. 15/643,282.
Final Office Action dated Apr. 22, 2021 for U.S. Appl. No. 15/643,285.
Non-Final Office Action dated May 12, 2021 for U.S. Appl. No. 15/643,274.
Non-Final Office Action dated Apr. 27, 2021 for U.S. Appl. No. 15/938,787.
Non-Final Office Action dated Nov. 9, 2020 for U.S. Appl. No. 15/643,282.
Final Office Action dated Mar. 5, 2021 for U.S. Appl. No. 15/643,279.
Non-Final Office Action dated Feb. 18, 2021 for U.S. Appl. No. 15/938,791.
Extended European Search Report dated Apr. 29, 2021 for EP Application No. 21164063.6.
Extended European Search Report dated May 3, 2021 for EP Application No. 21164064.4.
Non-Final Office Action dated Feb. 1, 2021 for U.S. Appl. No. 15/643,277.
Lyons, J.W., "SMEX-Lite Modular Solar Array Architecture," 2002 37th Intersociety Energy Conversion Engineering Conference (IECEC), pp. 204-208.
Lyons, J.W., https://slideplayer.com/slide/8876116/, NASA SMEX-Lite Online presentation, pp. 1-6, as downloaded Apr. 13, 2020.
"Space Exploration BETA", https://space.stackexchange.com/questions/8066/why-does-dscovr-appear-to-be-missing-solar-cells, Image of build solar panels, including backside, as downloaded Apr. 13, 2020.
Non-Final Office Action dated Dec. 22, 2020 for U.S. Appl. No. 15/643,285.
Non-Final Office Action dated Jan. 7, 2021 for U.S. Appl. No. 15/787,291.
Final Office Action dated Aug. 13, 2021 for U.S. Appl. No. 15/938,791.
Non-Final Office Action dated Aug. 18, 2021 for U.S. Appl. No. 15/643,285.
Non-Final Office Action dated Aug. 18, 2021 for U.S. Appl. No. 15/787,291.
Non-Final Office Action dated Aug. 18, 2021 for U.S. Appl. No. 15/787,304.
Non-Final Office Action dated Aug. 2, 2021 for U.S. Appl. No. 15/643,282.
Final Office Action dated Dec. 28, 2021 for U.S. Appl. No. 15/643,282.
Non-Final Office Action dated Dec. 6, 2021 for U.S. Appl. No. 15/643,279.
Final Office Action dated Jan. 20, 2022 for U.S. Appl. No. 15/643,285.
Non-Final Office Action dated Sep. 29, 2021 for U.S. Appl. No. 15/643,289.
Final Office Action dated Feb. 11, 2022 for U.S. Appl. No. 16/847,032.
Non-Final Office Action dated Sep. 17, 2021 for U.S. Appl. No. 15/643,277.
Final Office Action dated Dec. 15, 2021 for U.S. Appl. No. 15/787,304.
Final Office Action dated Feb. 24, 2022 for U.S. Appl. No. 15/643,277.
Final Office Action dated Dec. 9, 2021 for U.S. Appl. No. 15/938,787.
Final Office Action dated Dec. 17, 2021 for U.S. Appl. No. 15/787,291.
Non-Final Office Action dated Mar. 14, 2022 for U.S. Appl. No. 15/643,282.
Notice of Allowance dated Apr. 20, 2022 for U.S. Appl. No. 15/643,289.
Final Office Action dated Jun. 3, 2022 for U.S. Appl. No. 15/643,279.

* cited by examiner

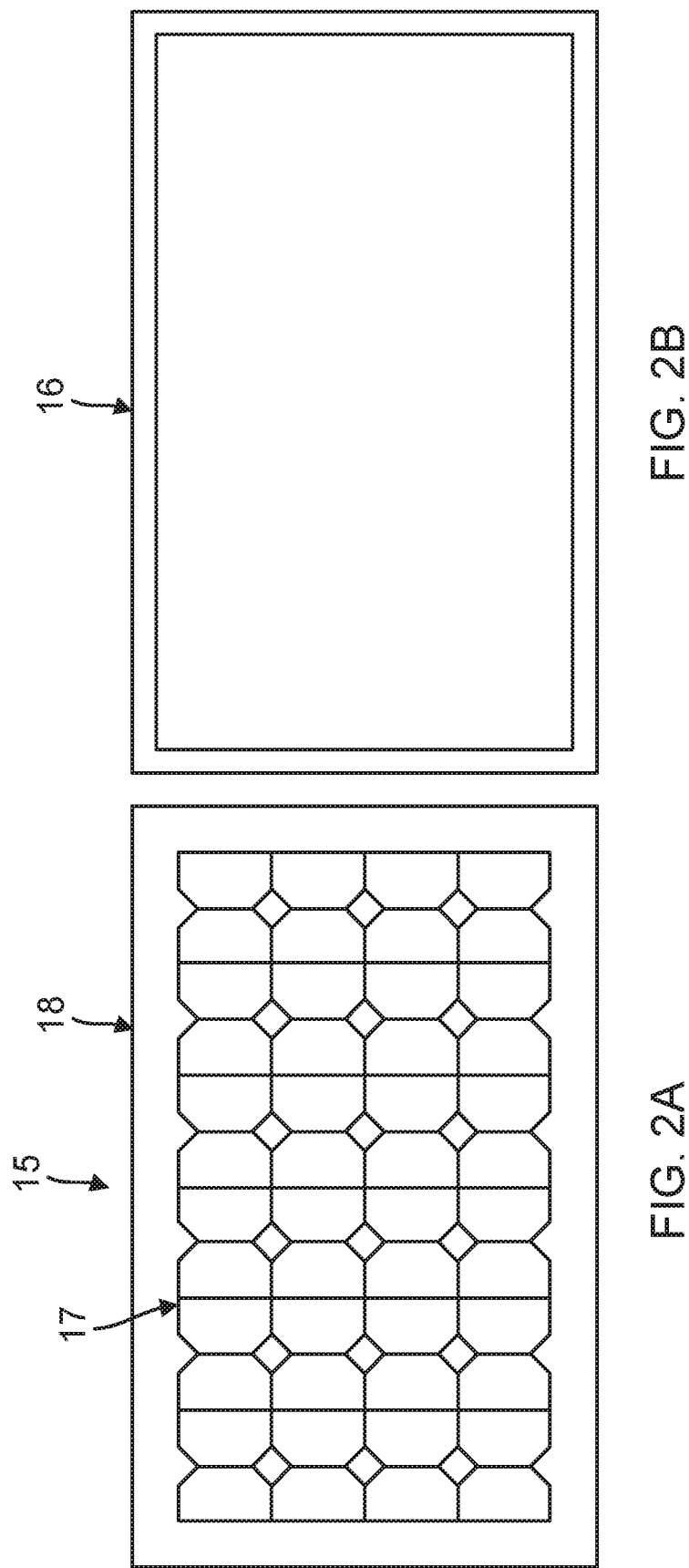

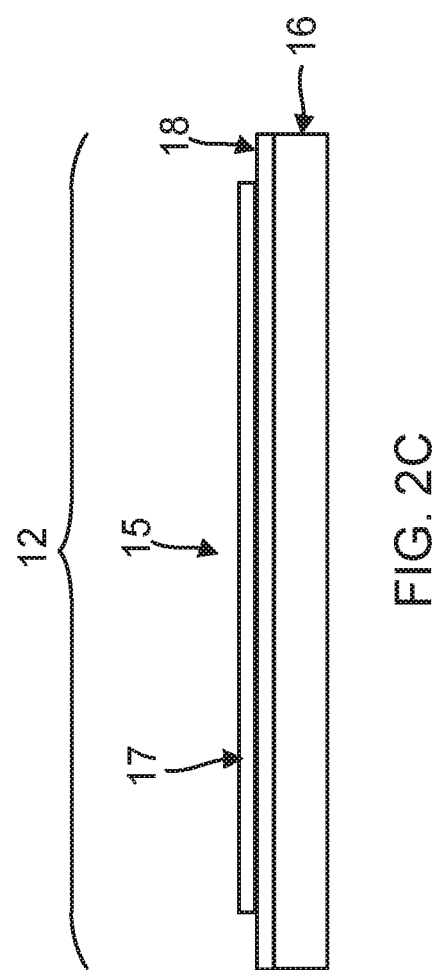

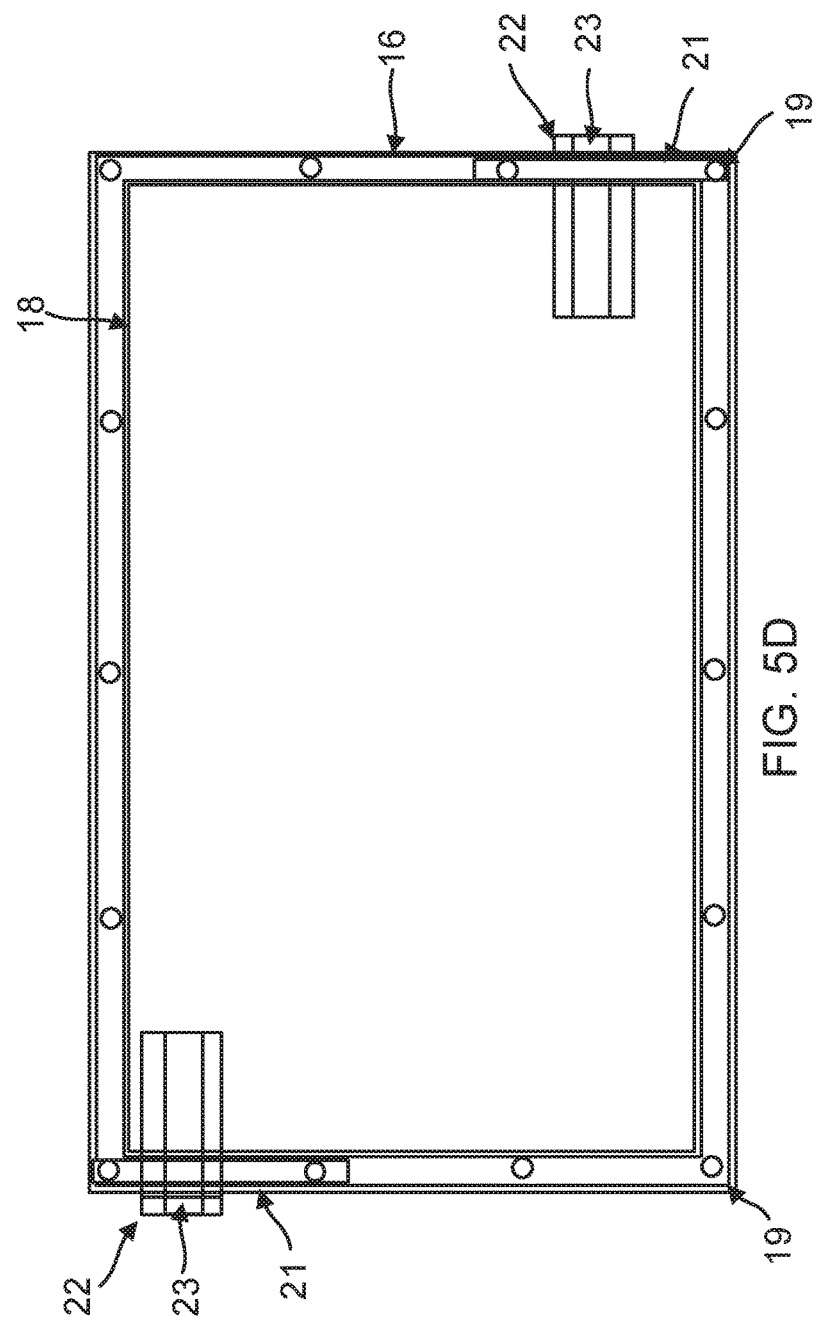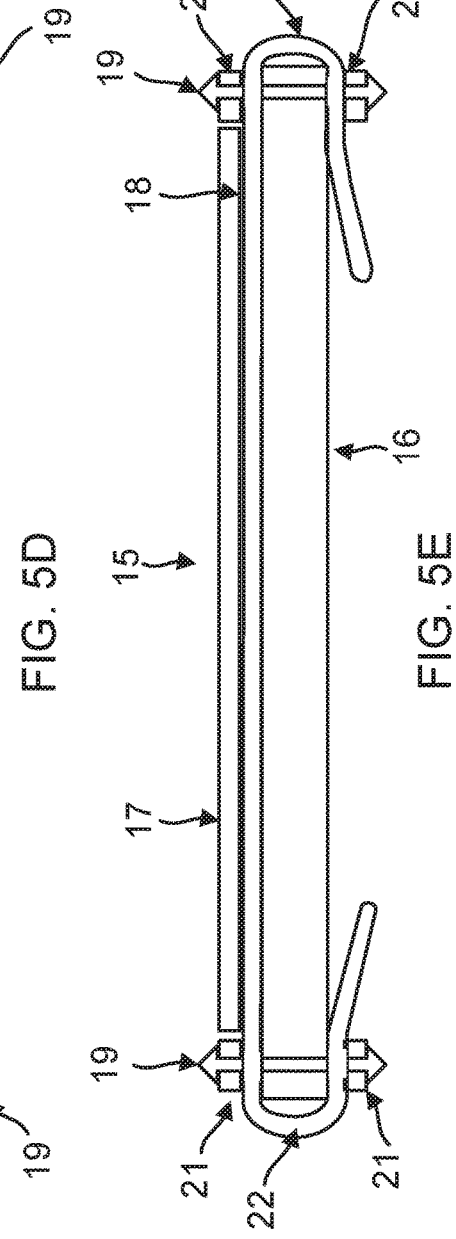

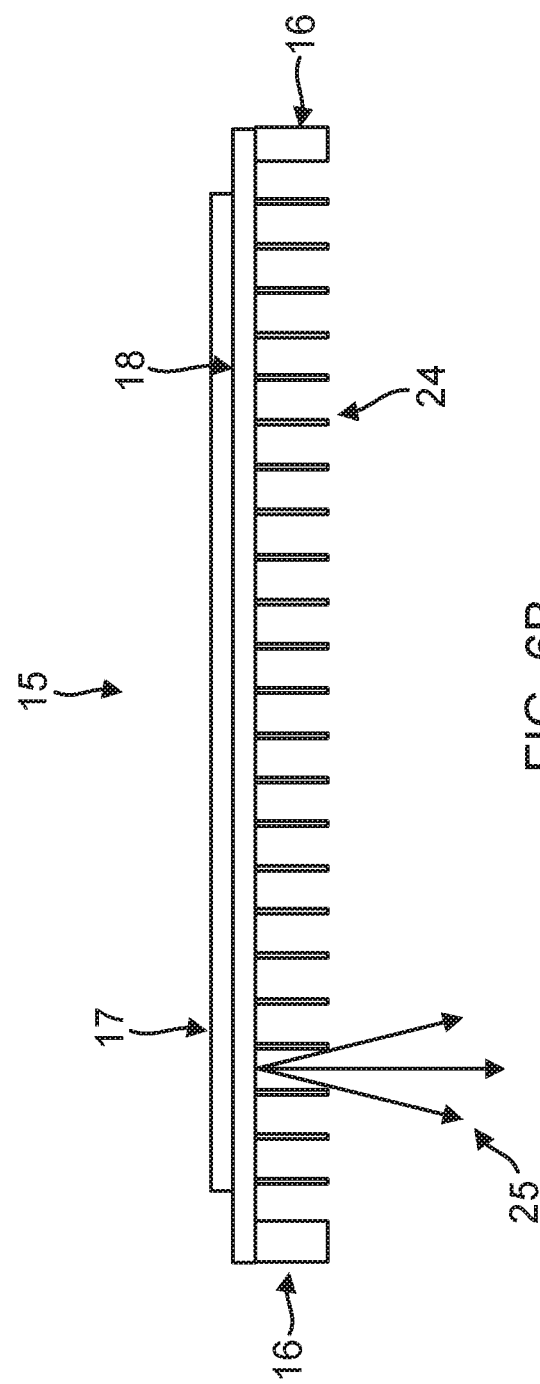

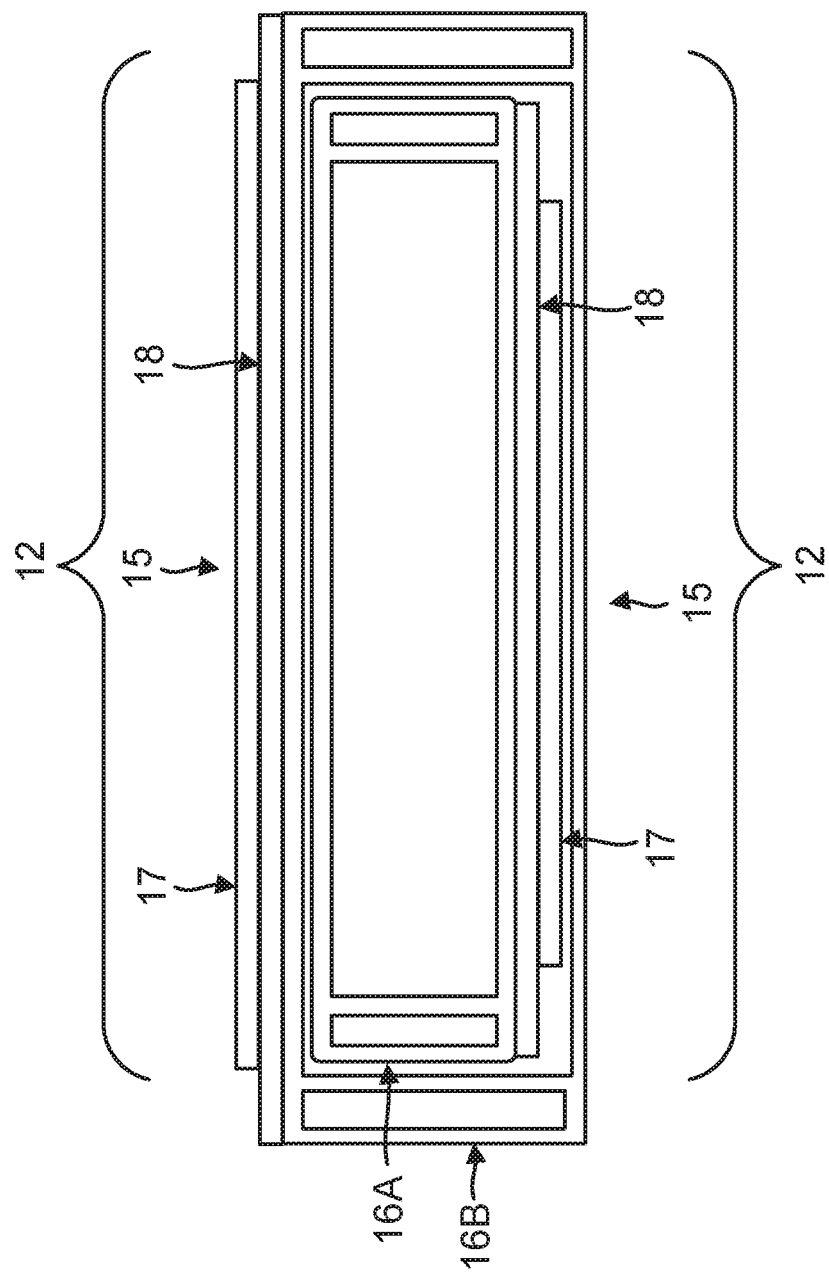

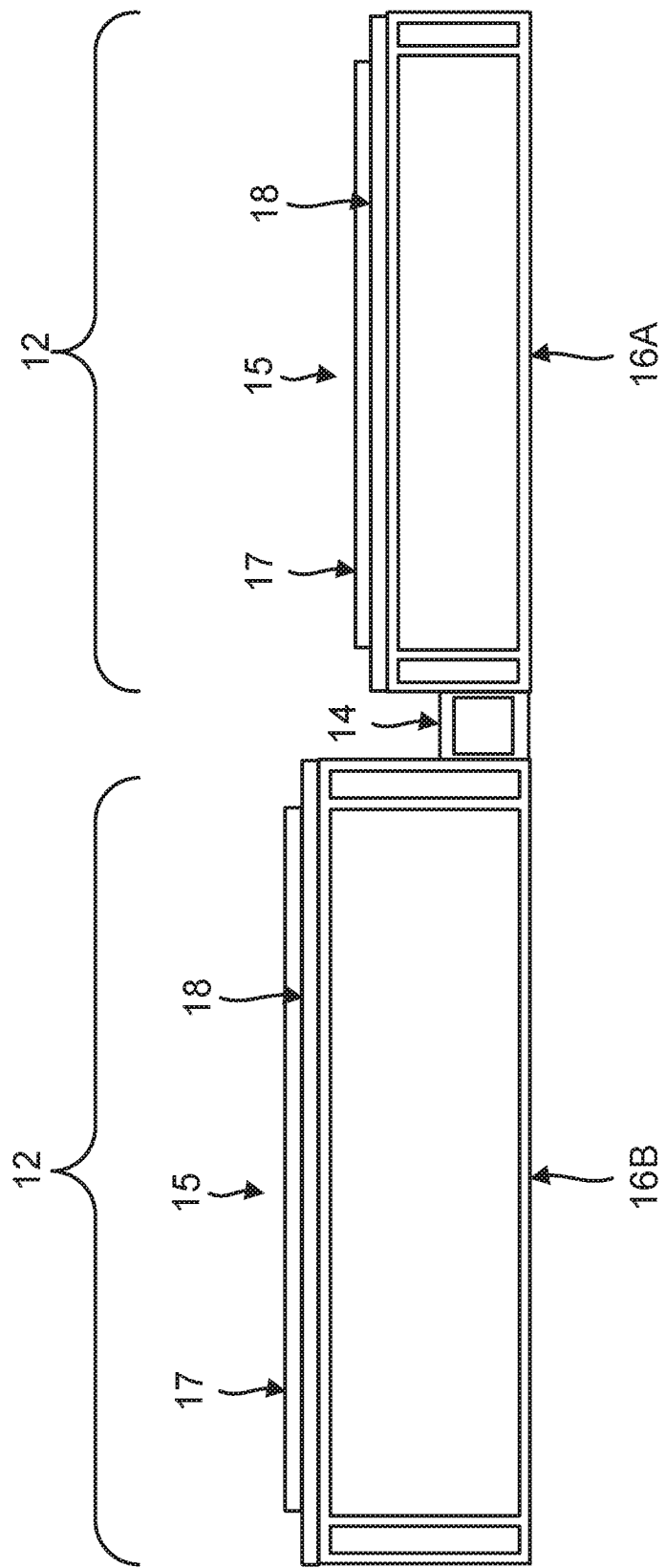

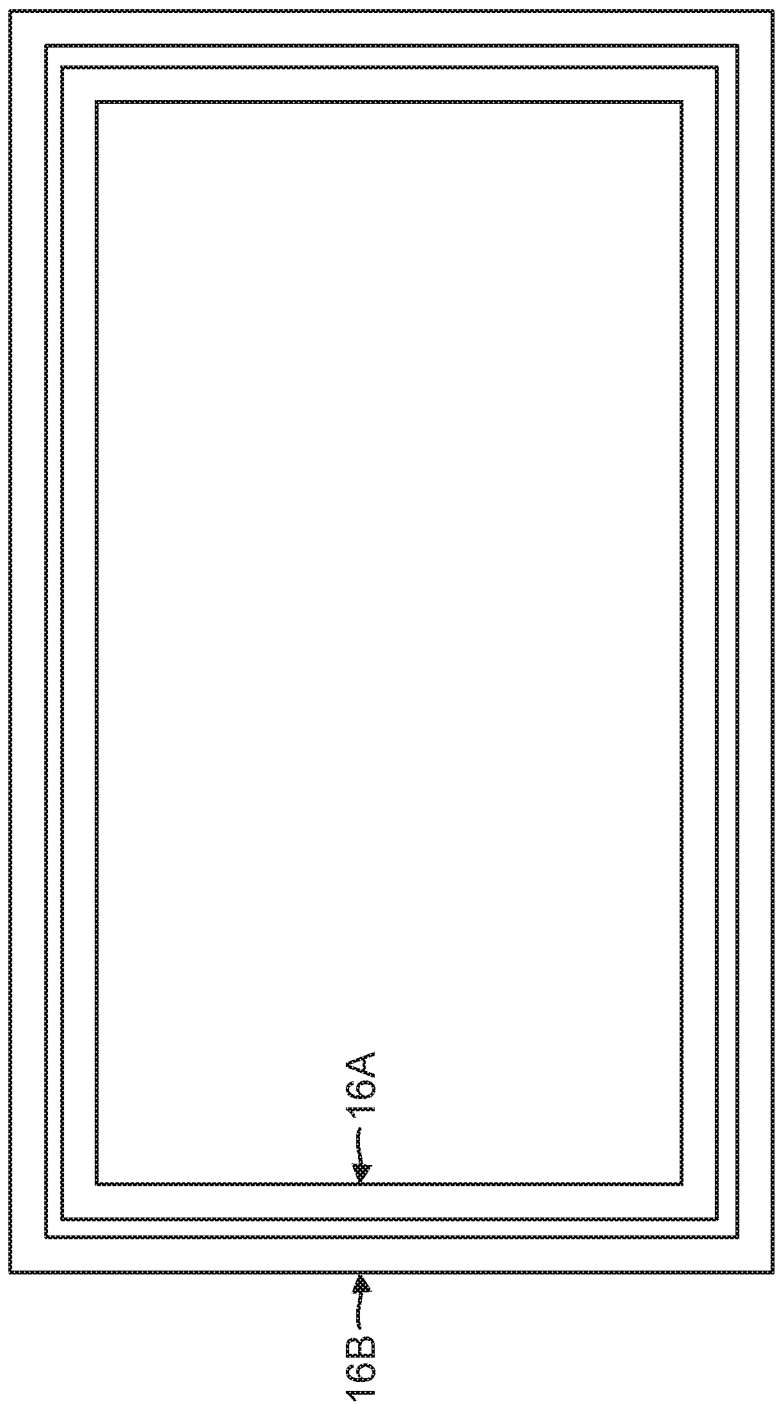

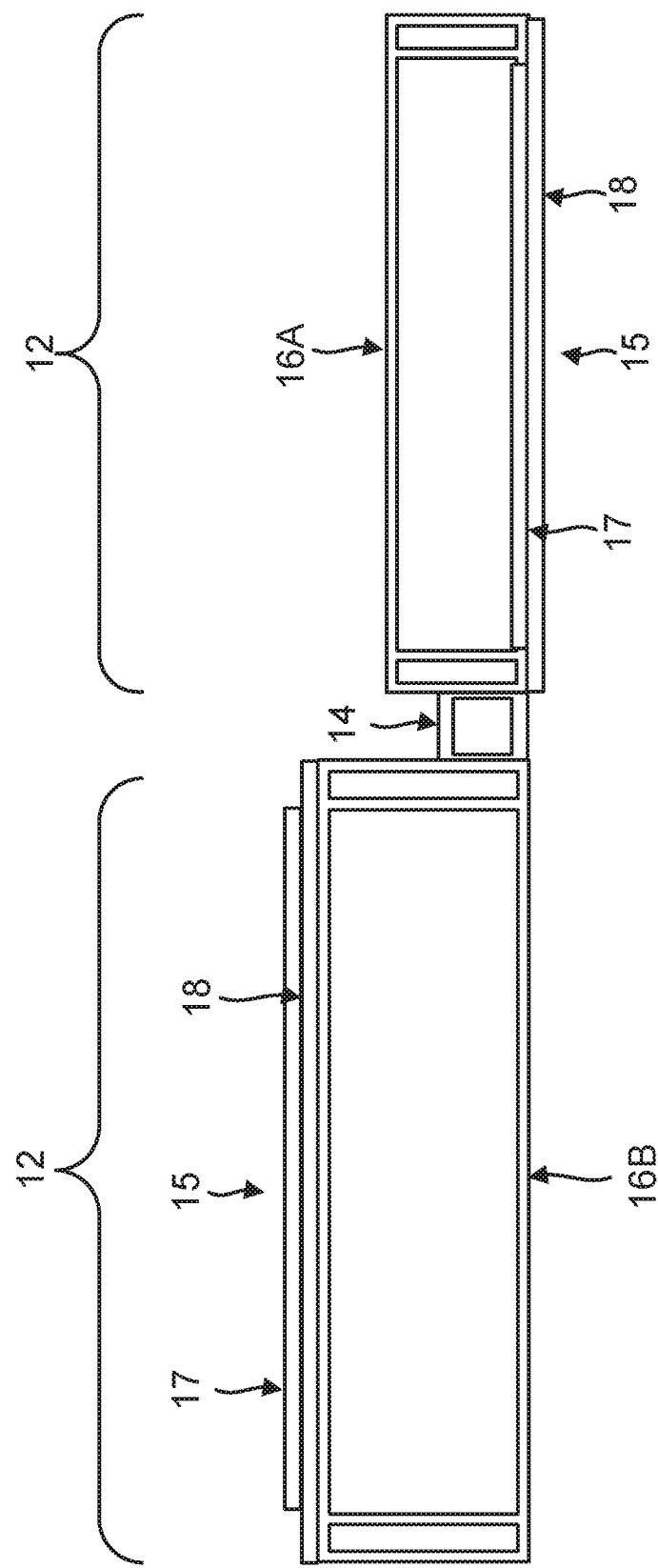

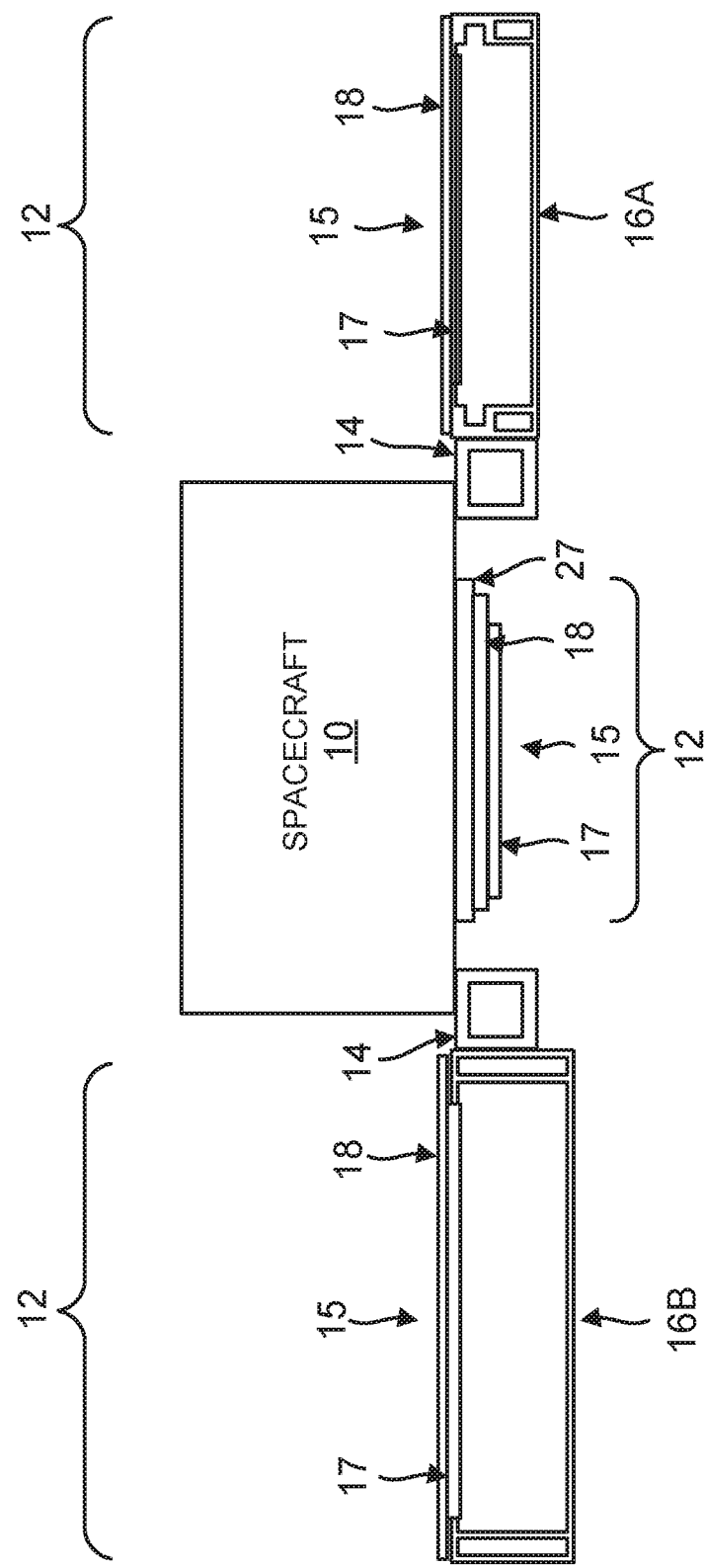

STACKED SOLAR ARRAY

CROSS REFERENCE TO RELATED APPLICATIONS

This application is related to the following co-pending and commonly-assigned applications:

U.S. Utility application Ser. No. 15/643,274, filed on Jul. 6, 2017, by Eric Rehder, entitled "SOLAR CELL ARRAY CONNECTIONS USING CORNER CONDUCTORS,";

U.S. Utility application Ser. No. 15/643,277, filed on Jul. 6, 2017, by Eric Rehder, entitled "PREFABRICATED CONDUCTORS ON A SUBSTRATE TO FACILITATE CORNER CONNECTIONS FOR A SOLAR CELL ARRAY,";

U.S. Utility application Ser. No. 15/643,279, filed on Jul. 6, 2017, by Eric Rehder, entitled "REWORK AND REPAIR OF COMPONENTS IN A SOLAR ARRAY,";

U.S. Utility application Ser. No. 15/643,282, filed on Jul. 6, 2017, by Eric Rehder, entitled "POWER ROUTING MODULE FOR A SOLAR ARRAY,";

U.S. Utility application Ser. No. 15/643,285, filed on Jul. 6, 2017, by Eric Rehder, entitled "POWER ROUTING MODULE WITH A SWITCHING MATRIX FOR A SOLAR CELL ARRAY,";

U.S. Utility application Ser. No. 15/643,287, filed on Jul. 6, 2017, by Eric Rehder, entitled "NANO-METAL CONNECTIONS FOR A SOLAR CELL ARRAY,"; and U.S. Utility application Ser. No. 15/643,289, filed on Jul. 6, 2017, by Eric Rehder, Philip Chiu, Tom Crocker, Daniel Law and Dale Waterman, entitled "SOLAR CELLS FOR A SOLAR CELL ARRAY,";

all of which applications claim the benefit under 35 U.S.C. Section 119(e) of the following co-pending and commonly-assigned provisional applications:

U.S. Provisional Application Ser. No. 62/394,636, filed on Sep. 14, 2016, by Eric Rehder, entitled "SOLAR CELL ARRAY CONNECTIONS,";

U.S. Provisional Application Ser. No. 62/394,616, filed on Sep. 14, 2016, by Eric Rehder, entitled "CORNER CONNECTORS FOR A SOLAR CELL ARRAY,";

U.S. Provisional Application Ser. No. 62/394,623, filed on Sep. 14, 2016, by Eric Rehder, entitled "PREFABRICATED CONDUCTORS ON A SUBSTRATE TO FACILITATE CORNER CONNECTIONS FOR A SOLAR CELL ARRAY,";

U.S. Provisional Application Ser. No. 62/394,627, filed on Sep. 14, 2016, by Eric Rehder, entitled "SELECT CURRENT PATHWAYS IN A SOLAR CELL ARRAY,";

U.S. Provisional Application Ser. No. 62/394,629, filed on Sep. 14, 2016, by Eric Rehder, entitled "MULTILAYER CONDUCTORS IN A SOLAR CELL ARRAY,";

U.S. Provisional Application Ser. No. 62/394,632, filed on Sep. 14, 2016, by Eric Rehder, entitled "REWORK AND REPAIR OF COMPONENTS IN A SOLAR CELL ARRAY,";

U.S. Provisional Application Ser. No. 62/394,649, filed on Sep. 14, 2016, by Eric Rehder, entitled "POWER ROUTING MODULE FOR A SOLAR CELL ARRAY,";

U.S. Provisional Application Ser. No. 62/394,666, filed on Sep. 14, 2016, by Eric Rehder, entitled "POWER ROUTING MODULE WITH A SWITCHING MATRIX FOR A SOLAR CELL ARRAY,";

U.S. Provisional Application Ser. No. 62/394,667, filed on Sep. 14, 2016, by Eric Rehder, entitled "NANO-METAL CONNECTIONS FOR A SOLAR CELL ARRAY,";

U.S. Provisional Application Ser. No. 62/394,671, filed on Sep. 14, 2016, by Eric Rehder, entitled "BACK CONTACTS FOR A SOLAR CELL ARRAY,";

U.S. Provisional Application Ser. No. 62/394,641, filed on Sep. 14, 2016, by Eric Rehder, entitled "PRINTED CONDUCTORS IN A SOLAR CELL ARRAY,"; and U.S. Provisional Application Ser. No. 62/394,672, filed on Sep. 14, 2016, by Eric Rehder, Philip Chiu, Tom Crocker and Daniel Law, entitled "SOLAR CELLS FOR A SOLAR CELL ARRAY,";

all of which applications are incorporated by reference herein.

This application also is related to the following co-pending and commonly-assigned applications:

U.S. Utility application Ser. No. 15/787,291, filed on Oct. 18, 2017, by Eric Rehder, entitled "SOLAR CELL ARRAY WITH CHANGEABLE STRING LENGTH,"; and U.S. Utility application Ser. No. 15/787,304, filed on Oct. 18, 2017, by Eric Rehder, entitled "SOLAR CELL ARRAY WITH BYPASSED SOLAR CELLS,";

both of which applications claim the benefit under 35 U.S.C. Section 119(e) of co-pending and commonly-assigned provisional applications:

U.S. Provisional Application Ser. No. 62/518,125, filed on Jun. 12, 2017, by Eric Rehder, entitled "SOLAR CELL ARRAY WITH CHANGEABLE STRING LENGTH,"; and U.S. Provisional Application Ser. No. 62/518,131, filed on Jun. 12, 2017, by Eric Rehder, entitled "SOLAR CELL ARRAY WITH BYPASSED SOLAR CELLS,";

all of which applications are incorporated by reference herein.

In addition, this application is related to the following co-pending and commonly-assigned applications:

U.S. Utility application Ser. No. 15/938,787, filed on Mar. 28, 2018, by Eric Rehder, entitled "SINGLE SHEET FOLD-OUT SOLAR ARRAY,"; and U.S. Utility application Ser. No. 15/938,791, filed on Mar. 28, 2019, by Eric Rehder, entitled "WIRING FOR A RIGID PANEL SOLAR ARRAY,";

both of which applications are incorporated by reference herein.

Finally, this application is related to the following co-pending and commonly-assigned application:

U.S. Utility application Ser. No. 16/847,032, filed on Apr. 13, 2020, by Eric Rehder, entitled "SOLAR ARRAY ATTACHMENT,";

which application is incorporated by reference herein.

BACKGROUND INFORMATION

1. Field

The disclosure is related generally to solar cell panels and more specifically to a stacked solar array.

2. Background

A spacecraft often uses solar arrays for electric power generation. A solar array generally is comprised of solar panels connected together, wherein each solar panel is populated with solar cells to generate the electric power. Usually, there is wiring across the solar panels to carry the electric power to the spacecraft.

Solar cells and their assemblies need to radiate heat away from the Sun to cool. As solar cells are built up into a solar array, the solar cells need to maintain high thermal conductivity to a radiating surface.

It is also desirable to build solar cells onto a thin substrate to achieve low cost manufacturing. This substrate could be a plastic sheet such as polyimide, a thin fiber composite, or thin metal sheet. This substrate has lateral strength, but is thin, lightweight, and likely flexible.

In addition, it is desirable to have a solar array based on rigid solar panels. This panel has more strength to deliver the rigidity and frequency response needed for the program. The panel is often an aluminum (Al) honeycomb with carbon composite face sheets. Thus, it is desirable to attach the thin substrate with the solar cells to a rigid panels.

However, this attachment requires a large area adhesive bond to ensure thermal contact to the rigid panel radiating surface. The large area adhesive bond is a large mass of material, which is undesirable for space applications.

Also, it is difficult to attach two flat surfaces of the substrate and rigid panel together without having trapped air. This trapped air will cause delamination or blowout when this assembly goes into a vacuum environment of space.

What is needed, then, is a means for simplifying the design and manufacturing, of solar arrays.

SUMMARY

To overcome the limitations described above, and to overcome other limitations that will become apparent upon reading and understanding the present specification, the present disclosure describes at least first and second solar panels are provided, wherein: each of the first and second solar panels is comprised of a substrate having one or more solar cells bonded thereto, and a frame for supporting the substrate and the solar cells; the frame has a cutout or opening under the solar cells and, when deployed, the cutout or opening enables cooling of the solar cells through the substrate by exposing a back side of the substrate for transferring or radiating heat directly through the cutout or opening of the frame; and the frame of the first solar panel is configured to be nested inside the cutout or opening of the frame of the second solar panel when the first and second solar panels are stowed in a stacked configuration.

DRAWINGS

Referring now to the drawings in which like reference numbers represent corresponding parts throughout:

FIGS. 2A, 2B and 2C are top-view, top-view and cross-sectional side-view schematics, respectively, illustrating the components and assembly of one of the solar panels.

FIGS. 5A, 5B, 5C and 5D are top-view schematics and FIG. 5E is a cross-sectional side-view schematic providing greater detail on electrical connections to the solar cells.

FIG. 6A is a top-view schematic and FIG. 6B is a cross-sectional side-view schematic illustrating reinforcing materials that may be used to fill the center of the frame.

FIGS. 8A, 8B and 8C are top-view, cross-sectional side-view, and side-view schematics, respectively, illustrating another configuration of the solar panels.

FIGS. 9A, 9B and 9C are top-view, cross-sectional side-view, and side-view schematics, respectively, illustrating yet another configuration for the solar panels.

FIGS. 10A and 10B are cross-sectional side-view schematics illustrating yet another configuration involving solar panels mounted on a spacecraft.

DETAILED DESCRIPTION

Figure 1:
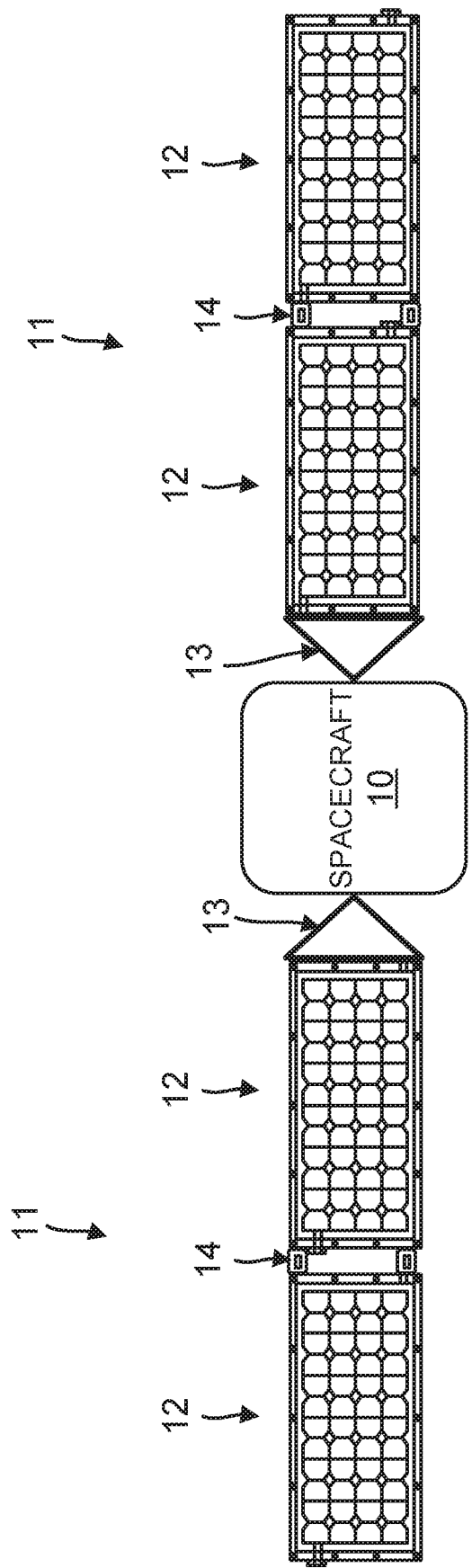
FIG. 1 is a schematic of a spacecraft with one or more solar arrays comprised of one or more solar panels.

In the following description, reference is made to the accompanying drawings which form a part hereof, and in which is shown by way of illustration a specific example in which the disclosure may be practiced. It is to be understood that other examples may be utilized and structural changes may be made without departing from the scope of the present disclosure.

Overview

This disclosure provides a "flex on frame" concept for solar arrays, wherein a solar array includes at least one solar panel comprised of one or more solar cells bonded onto a substrate, which may be a flexible substrate, and the substrate and the solar cells are then attached to a support frame having a cutout or opening in a center of the frame under the solar cells. The substrate is thin to facilitate heat flow and thus it has a low stiffness that may bend and warp making it unsuitable for flight alone. The substrate is attached to the frame that provides the stiffness for the structure to be used as a solar panel.

The "flex on frame" concept for solar arrays has a number of advantages. For example, the "flex on frame" concept has both cost and cycle time advantages, as compared to solar arrays with solid solar panels.

Another advantage of the "flex on frame" concept for solar arrays is the cutout or opening in the frame. The cutout or opening enables the substrate to become the radiator into space, thus eliminating the typical thick rigid panel from the heat flow to the radiating surface. Solid solar panels have to integrate features to facilitate removing heat from the solar arrays, which can add complexity and weight to the assembly.

In the "flex on frame" concept, thermal connection to the frame is not required, but is permissible, simplifying attachment of the circuit to the panel (e.g., simple mechanical fasteners or clamps). This differs from a solid panel using a necessary solid substrate or other material (e.g., metal plate) meant to transfer heat away from the solar cells laterally.

Moreover, by having such a cutout or opening, the frame can, but need not, take part in thermal transport from the solar cells like a solid solar panel. Primarily, the frame provides mechanical support for the substrate with the solar cells bonded thereon. This enables separation of thermal and mechanical roles as compared to solid solar panels, if desired.

The "flex on frame" concept for solar arrays may result in a less rigid structure than solid solar panels, for equivalent thickness structures. There is a correlation between stiffness and the fundamental mode or frequency of a solar panel, which is modified when a solar panel is solid as opposed to when it is a only a frame having a cutout or opening. Solid solar panels have high stiffness to have a higher fundamental mode or frequency, while the "flex on frame" concept has a lower fundamental mode or frequency than a solid solar panel of the same thickness.

The vibrational frequency of the solar panels is an important metric. A more rigid structure having a higher fundamental mode or frequency results in a more stable spacecraft.

This disclosure provides the "flex on frame" concept in a stacked configuration comprising at least two frames, each having a thickness, wherein a first frame is configured to nest with a second frame. A cutout or opening in a center of the frame allows multiple frames to be stacked inside of each other. This allows the frames to be thicker than a solid solar panel and therefore increases the rigidity in the stacked configuration during launch and transport, while reducing weight and enabling efficient thermal dissipation when deployed and operating.

These and other novel aspects to the "flex on frame" concept are described in more detail below.

Technical Description

FIG. 1 is a schematic of a spacecraft 10 with one or more solar arrays 11 comprised of one or more solar panels 12. In this example, the spacecraft 10 comprises a satellite, and there are two (2) solar arrays 11, and four (4) solar panels 12, wherein each of the solar arrays 11 is comprised of two of the solar panels 12, and the solar arrays 11 and solar panels 12 extend on both sides of the spacecraft 10. The solar arrays 11 are attached to the spacecraft 10 by means of triangular trusses 13 or other mechanisms, and each of the solar panels 12 is attached to an adjacent solar panel 12 by means of hinges 14 or other mechanisms, wherein the triangular trusses 13 and hinges 14 allow the solar arrays 11 and solar panels 12 to be folded and stacked for storage during launch, and then extended and deployed during operation.

FIGS. 2A, 2B and 2C are top-view, top-view and cross-sectional side-view schematics, respectively, illustrating the components and assembly of one of the solar panels 12, including a solar power module (SPM) 15 and a frame 16.

FIG. 2A shows the SPM 15, which is comprised of an array of solar cells 17 bonded to a substrate 18. In one example, the substrate 18 is a flexible substrate, namely a flex circuit comprised of a laminate of one or more Kapton™ insulating layers and one or more metal layers providing electrical interconnects.

FIG. 2B shows the frame 16 for supporting the solar cells 17 and substrate 18, wherein the frame 16 is a rectangular structure formed, for example, of joined pieces defining a perimeter around a cut-out or opening in a center of the frame 16 under the solar cells 17.

FIG. 2C shows the SPM 15 mounted on and attached to the frame 16, wherein the substrate 18 is attached to the frame 16 at a perimeter of the frame 16 along one or more edges of the substrate 18. Once mounted and attached, the SPM 15 and frame 16 comprise a solar panel 12.

A conventional rigid solar panel is a solid shape, often rectangular, but can be any shape. In this disclosure, the solar panel 12 is largely hollow due to the configuration of the frame 16.

In this example, the substrate 18 is a thermal structure for radiating heat from the solar cells 17 into outer space, and the frame 16 is a mechanical structure for supporting the solar cells 17 and the substrate 18. Specifically, the cutout or opening at the center of the frame 16 enables cooling of the solar cells 17 through the substrate 18 by exposing a back side of the substrate 18 for radiating heat directly through the cutout or opening of the frame 16. The goal is for the radiated heat flow of the solar cells 17 and the substrate 18 to outer space to be minimally shadowed by the mechanical structure of the frame 16.

In another example, it is possible to have reinforcing materials and/or supporting members (not shown) inside the frame 16 to increase stiffness, wherein the reinforcing materials could be mesh, honeycomb material, or the like, and the supporting members could be various bars, channels, or the like. This is described in more detail below in conjunction with FIGS. 6A and 6B.

Figure 3A:
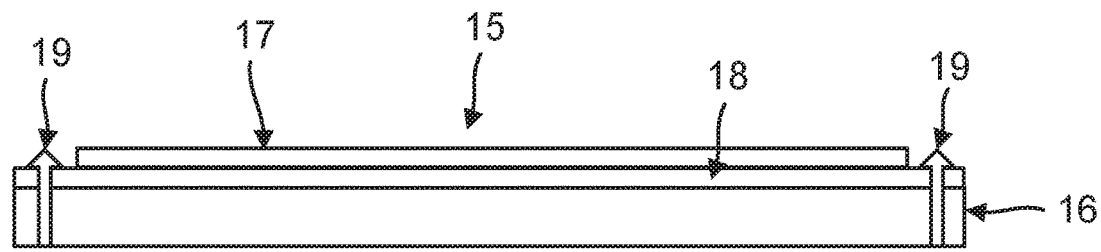
FIGS. 3A and 3B are a cross-sectional side-view schematic and a top-view schematic, respectively, of the substrate attached to the frame using one or more fasteners.
Figure 3B:
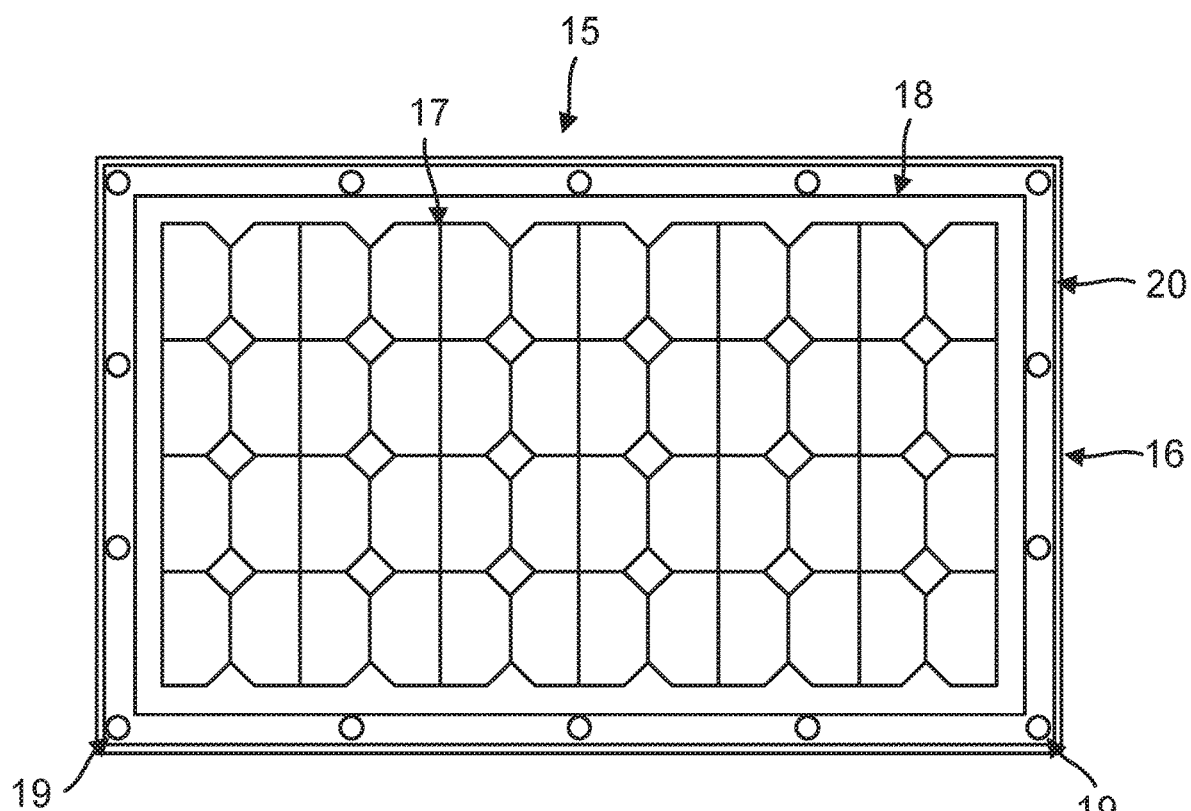

FIGS. 3A and 3B are a cross-sectional side-view schematic and a top-view schematic, respectively, of the SPM 15, frame 16, solar cells 17 and substrate 18, wherein the substrate 18 is attached to the frame 16 using one or more fasteners 19 and reinforced areas 20.

A wide variety of fasteners 19 can be used, including pins, posts, rivets or other structures, and the fasteners 19 may be comprised of metal, polymer, or other types of materials. Adhesives of various types could be used with the fasteners 19, or as an alternative to the fasteners 19, with continuous or spot application.

The fasteners 19 may attach to a single surface of the frame 16 or extend through the frame 16. It may be desirable that the fasteners 19 are reversible to allow disassembly for repairs, and reversing the fasteners 19 could involve destroying them, such as in cutting or drilling the fasteners 19, which should not be a major concern due to their low cost.

As shown in FIG. 3B, the fasteners 19 may be placed in reinforced areas 20 of the substrate 18 near the edges of the substrate 18, or in other areas of the substrate 18, to prevent tearing of the substrate 18. The reinforced areas 20 may be comprised of additional Kapton™ insulating layers, carbon fiber, Kevlar™, and/or metal layers, or some other combination of layers, or some other material. It would be rather straightforward to pattern a copper (Cu) trace layer as a reinforcement. Additionally, the frame 16 material may also be reinforced in proximity to the fasteners 19.

In this example, four (4) or five (5) of the fasteners 19 are positioned on each of the four (4) sides of the frame 16, around the perimeter of the frame 16, and near the edges of the substrate 18. In other examples, it may only be necessary to attach the SPM 15 to two (2) opposing sides of the frame 16. On the other hand, attaching the SPM 15 to all four (4) sides of the frame 16 does offer assurances regarding the security of the attachment of the SPM 15 to the frame 16.

Figure 4A:
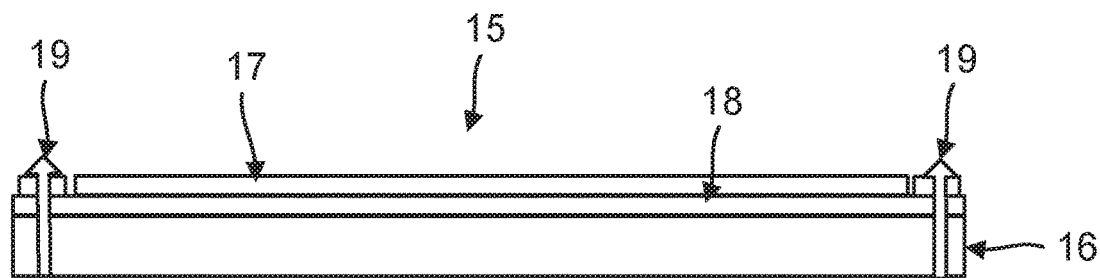
FIGS. 4A and 4B are a cross-sectional side-view schematic and a top-view schematic, respectively, of the substrate attached to the frame using one or more bars located along one or more sides of the frame.
Figure 4B:
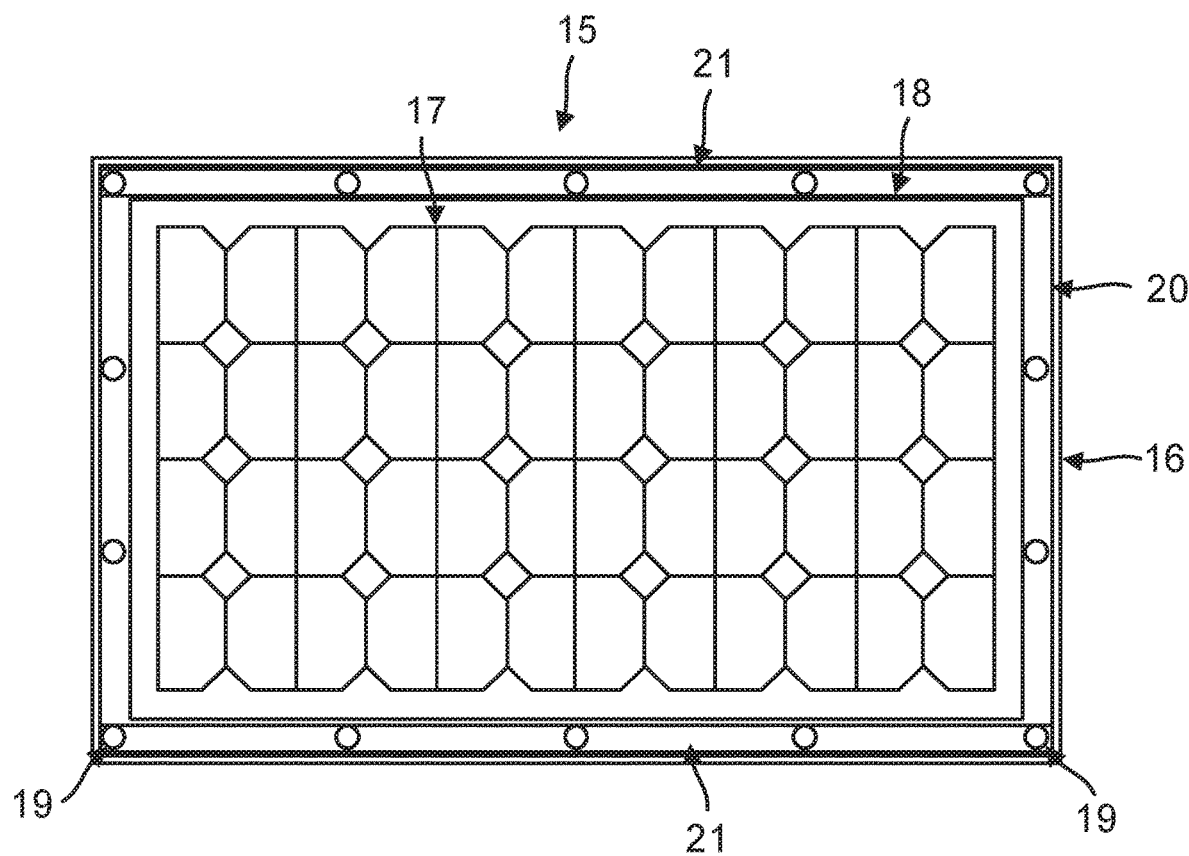

FIGS. 4A and 4B are a cross-sectional side-view schematic and a top-view schematic, respectively, of the SPM 15, frame 16, solar cells 17, substrate 18, fasteners 19 and reinforced areas 20, wherein the substrate 18 is attached to the frame 16 using one or more bars 21 located along one or more sides of the frame 16, for example, in the reinforced areas 20 near the edges of the substrate 18 and between at least some of the fasteners 19 and the substrate 18. These bars 21 serve to spread the force applied by the fasteners 19 and thus minimize the risk of tearing the substrate 18. These bars 21 could be rectangular or another shape, preferably matching the geometry of the frame 16. The bars 21 could also be comprised of a series of one or more shorter segments. FIG. 3B illustrates reinforcement at a single attachment position, while FIG. 4B illustrates reinforcement that spans multiple attachment positions.

Figure 5A:
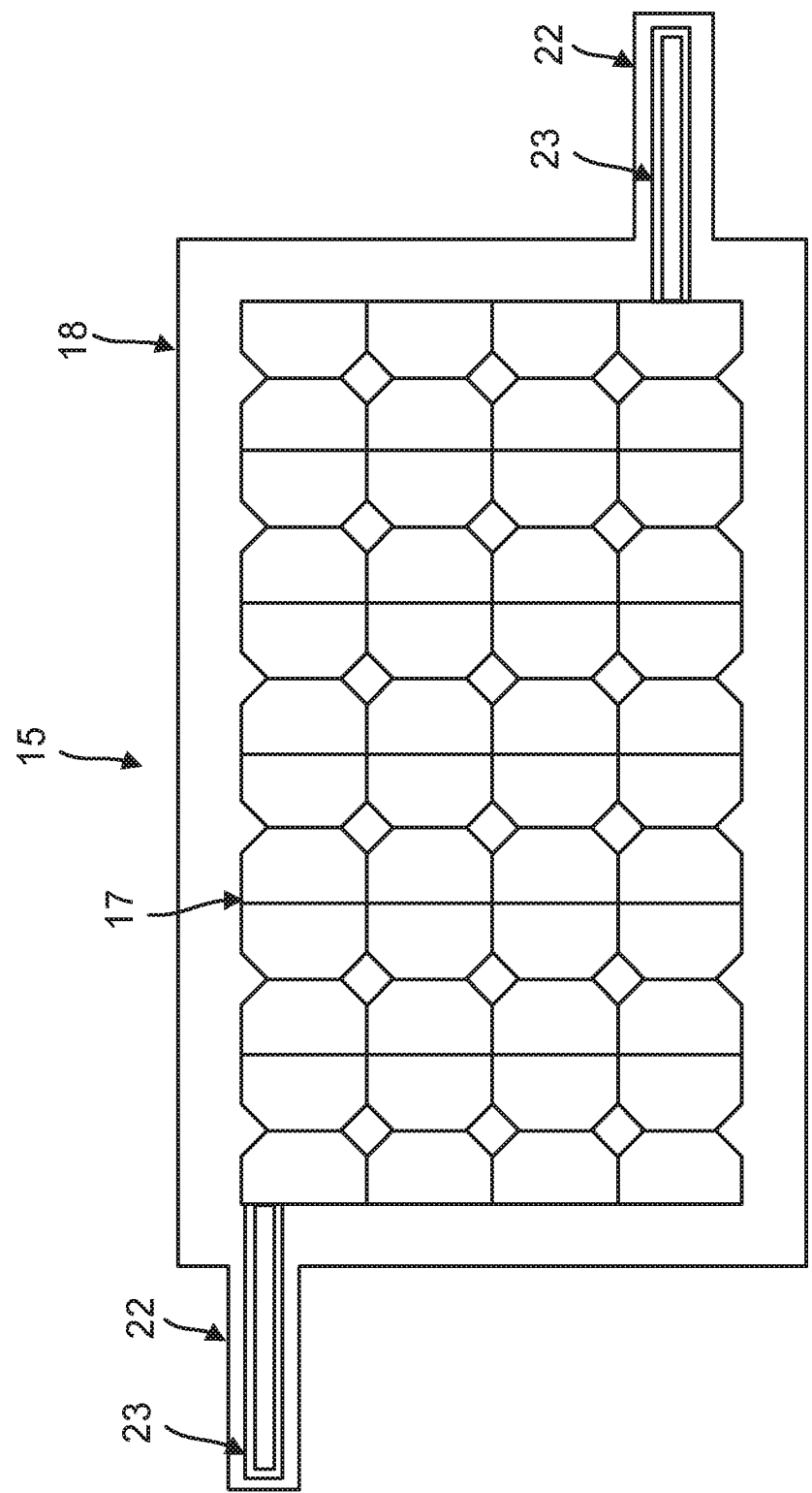

FIGS. 5A, 5B, 5C and 5D are top-view schematics and FIG. 5E is a cross-sectional side-view schematic providing greater detail on electrical connections to the solar cells 17. It is preferred that wiring for the electrical connections to the solar cells 17 be on a back side of the substrate 18, so that as much area as possible on the front side of the solar cells 17 is used to collect the Sun's energy.

FIG. 5A is a top-view schematic of the SPM 15, solar cells 17 and substrate 18, before being mounted on and attached to the frame 16, wherein the substrate 18 has one or more tabs 22 extending from one or more sides of the substrate 18. Each of the tabs 22 may be comprised of the same materials as the substrate 18, and may be contiguous portions of the substrate 18. Each of the tabs 22 may include one or more electrical conductors 23, patterned from one or more metal layers deposited on a surface of the tabs 22 and/or buried within the layers of the tabs 22, for making electrical connections to at least one of the solar cells 17.

Figure 5B:
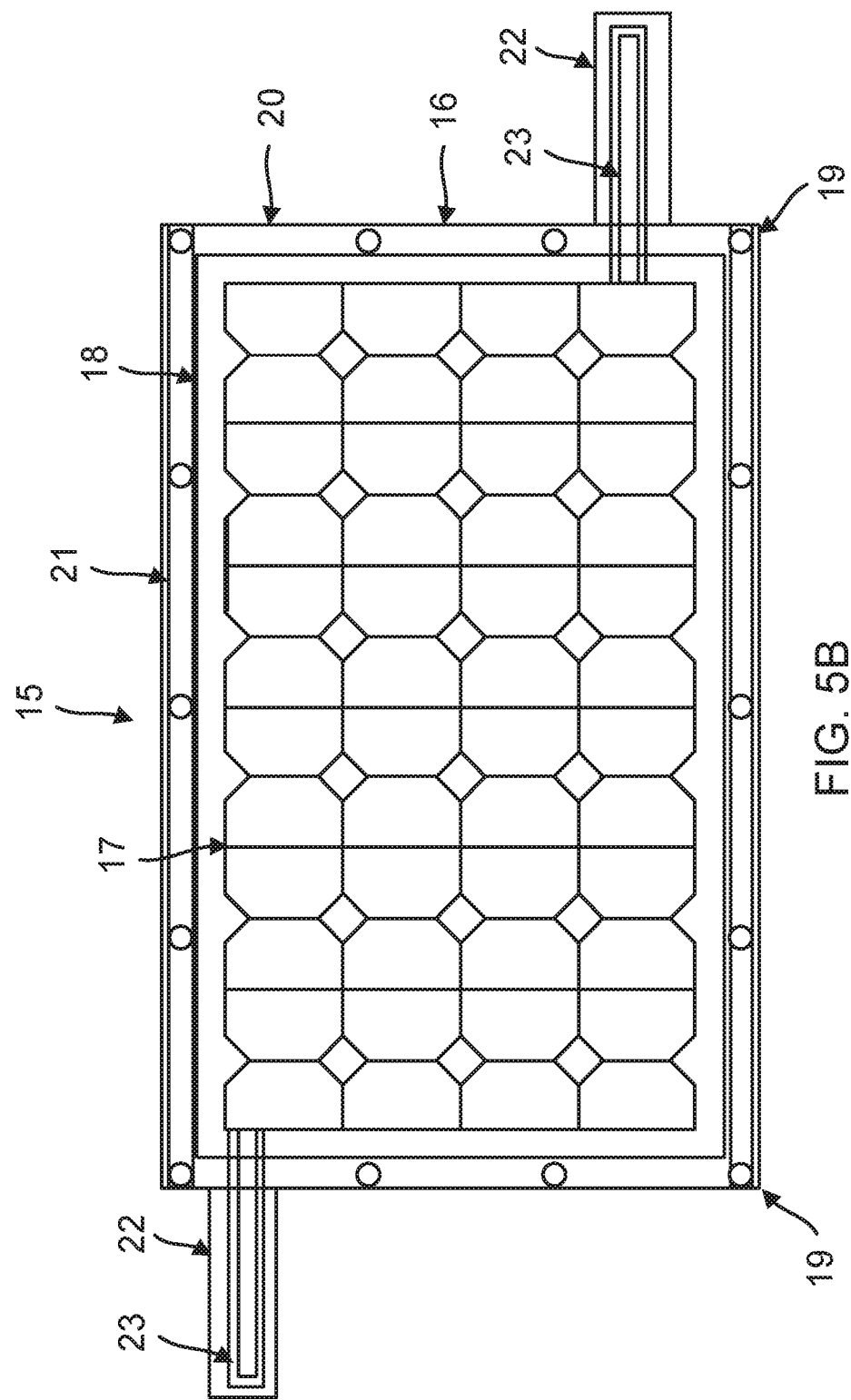

FIG. 5B is a top-view schematic of the SPM 15, frame 16, solar cells 17, substrate 18, fasteners 19, reinforced areas 20, and bars 21, wherein the substrate 18 is attached to the frame 16 with fasteners 19 at the reinforced areas 20 and bars 21, and the tabs 22 and electrical conductors 23 extend beyond the frame 16.

Figure 5C:
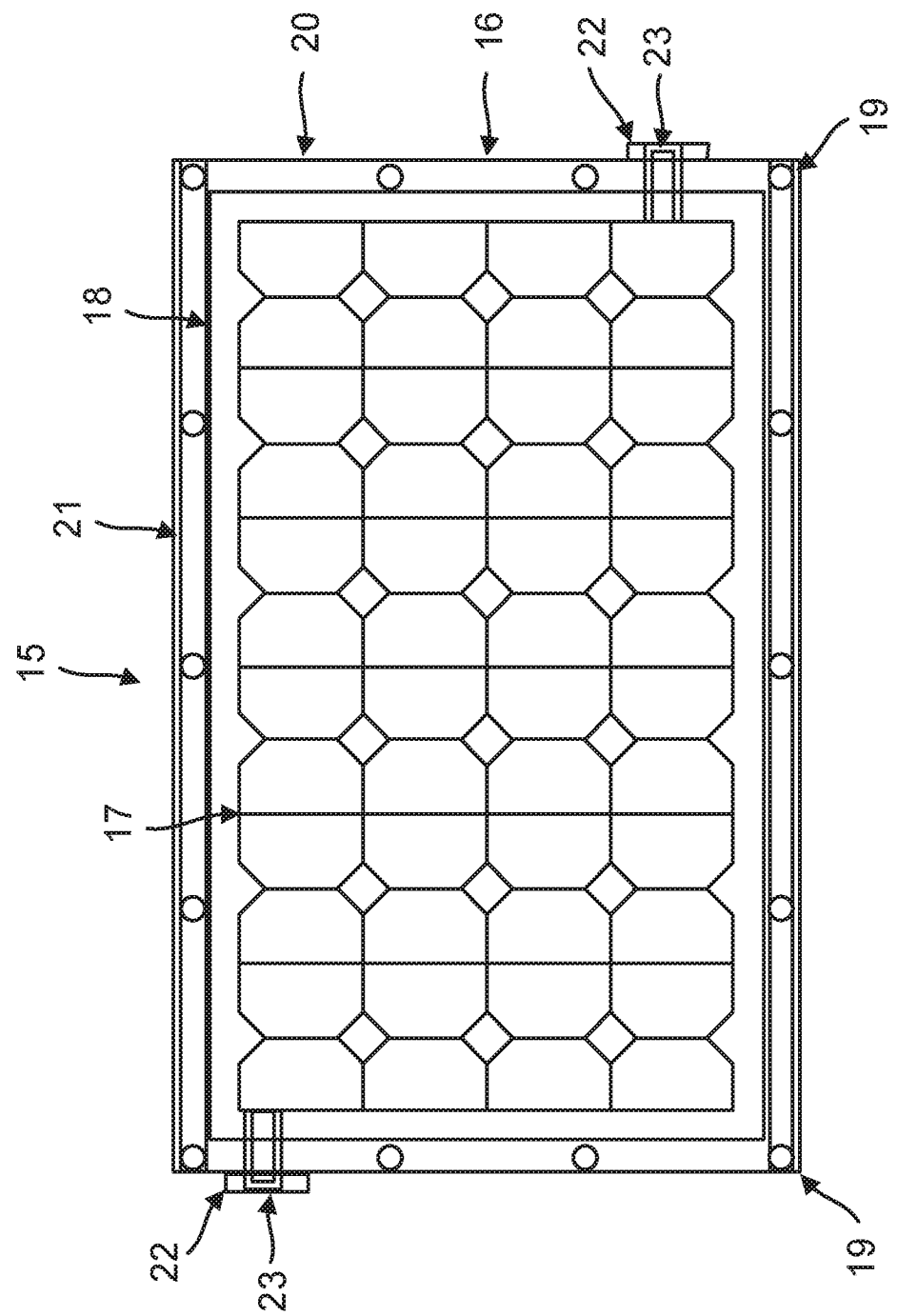

FIG. 5C is a top-view schematic of the SPM 15, frame 16, solar cells 17, substrate 18, fasteners 19, reinforced areas 20, and bars 21, wherein the tabs 22 and electrical conductors 23 are folded around and under the frame 16.

FIG. 5D is a bottom-view schematic of the frame 16, substrate 18, fasteners 19, and bars 21, wherein the tabs 22 and electrical conductors 23 are folded around and under the frame 16, and the tabs 22 are attached to the back side of the substrate 18, for example, with adhesive, fasteners, bars, or the like. The tabs 22 could also be attached to one or more sides of the frame 16, including the bottom side, front side and perimeter sides of the frame 16.

In this example, the tabs 22 extend around the outside of the frame 16, and then pass under and are secured by the bars 21. Another option could be to pass the tabs 22 through a slot or channel in the frame 16. In yet another option, the substrate 18 could be structured to end at the opening of the frame 16, which would allow the tabs 22 to fold down inside the frame 16, instead of outside the edge of the frame 16. In still another option, the tabs 22 could also be attached to one or more sides of the frame 16 and simply extend back away from the Sun.

The electrical conductors 23 may be electrically connected to conductors or traces (not shown) deposited on the back side of the substrate 18 and/or buried within the substrate 18, through the use of exposed conductors or traces, vias and the like.

FIG. 5E is a cross-sectional side-view schematic of the SPM 15, frame 16, solar cells 17, substrate 18, fasteners 19, bars 21 and tabs 22, wherein the tabs 22 are wrapped around the frame 16 to the back side of the substrate 18. Here, the substrate 18 is visible on the top side of the frame 16 and bends around the outside of the frame 16. Preferably, the tabs 22 are positioned to have minimal shadowing of the radiation from the back side of the substrate 18. For example, the tabs 22 could be positioned behind the structure of the frame 16 to minimize shadowing.

The ends of the tabs 22 are available to make connections to other electrical conductors, such as a wiring harness (not shown), to carry power to adjacent frames 16, panels 12, arrays 11, other structures, and the spacecraft 10 itself. For example, the wiring harness may be positioned along the back of the substrate 18, the back of the frame 16, or the side of the frame 16. The wiring harness may extend partially or completely inside the frame 16 when the frame 16 is comprised of hollow members. The electrical conductors in the wiring harness may form part of the frame 16 when the frame 16 is constructed as a composite or through additive manufacturing.

Figure 6A:
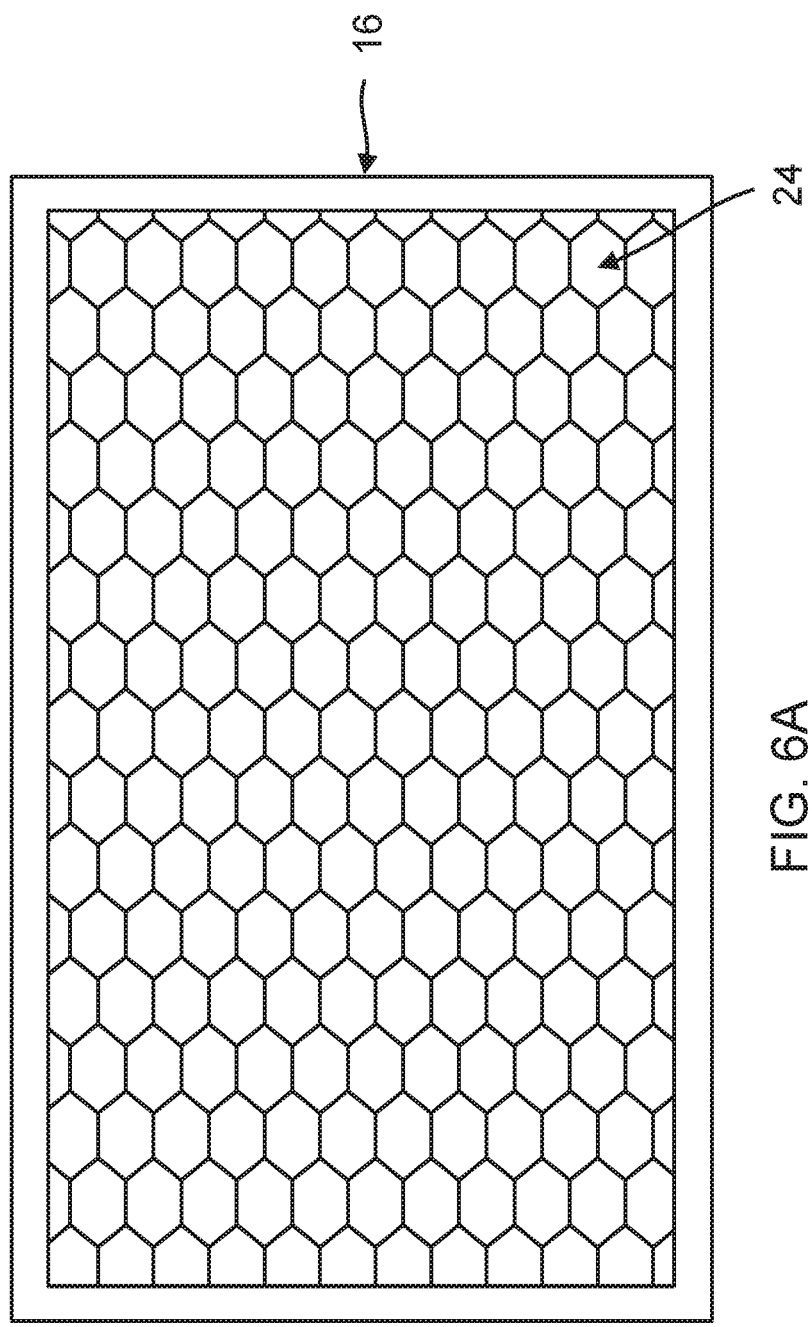

FIG. 6A is a top-view schematic and FIG. 6B is a cross-sectional side-view schematic illustrating reinforcing materials 24 that may be used to fill the center of the frame 16, wherein FIG. 6A shows only the frame 16 and the reinforcing materials 24, and FIG. 6B shows the SPM 15 mounted on and attached to the frame 16, with the substrate 18 attached to both the frame 16 and the reinforcing materials 24, the solar cells 17 bonded to the substrate 18 above the reinforcing materials 24.

In one example, these reinforcing materials 24 may be designed to allow radiation at normal incidence to reach the solar cells 17, and to block radiation at non-normal incidence from reaching the solar cells 17. For example, space radiation (e.g., electrons, protons, gamma rays) bombards the solar array 11 and solar panels 12 at all angles. The use of a honeycomb structure as the reinforcing materials 24 in the frame 16 can be used to block the space radiation at non-normal incidence, and thus shield the solar cells 17 from damage, while allowing radiative cooling 25 to occur at normal incidence.

It is important for the solar panel 12 to pass acoustic and vibration testing. Attachment of the substrate 18 to the reinforcing materials 24 below the substrate 18 can limit vibrations and improve survivability. Acoustic and vibration environment occurs during the launch phase while the solar panels 12 are folded and stowed against the side of the spacecraft 10. In this condition, the solar cells 17 from one panel 12 may be facing the reinforcing materials 24 from a second panel 12. Their mechanical engagement should be designed to withstand the acoustic and vibration requirements. Employing shock absorbing or soft materials such as foam between the solar cells 17 or substrate 18 and the reinforcing materials 24 of the next panel 12 would be advantageous.

Figure 7A:
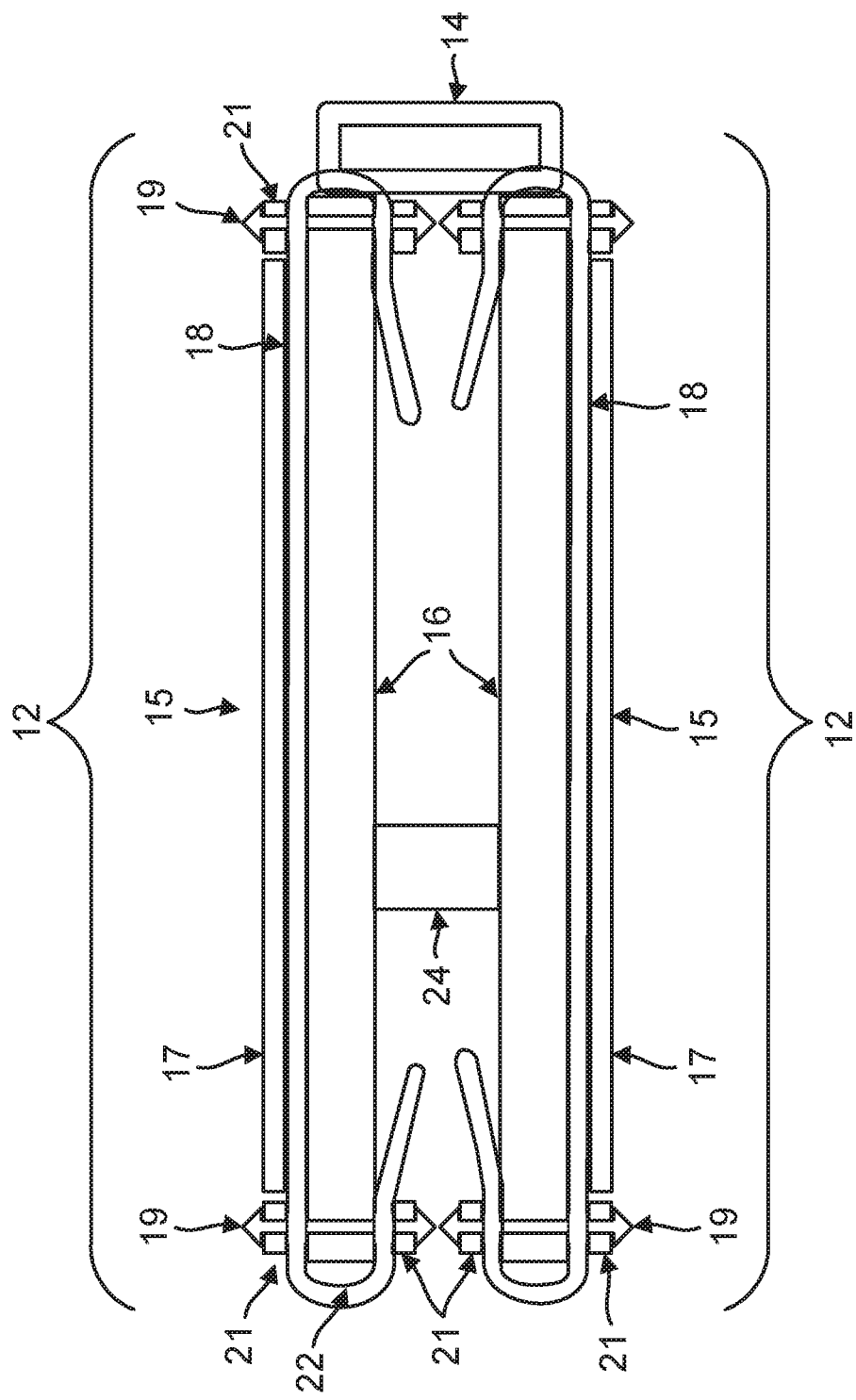
FIGS. 7A and 7B are cross-sectional side-view schematics illustrating a configuration of the solar panels.
Figure 7B:
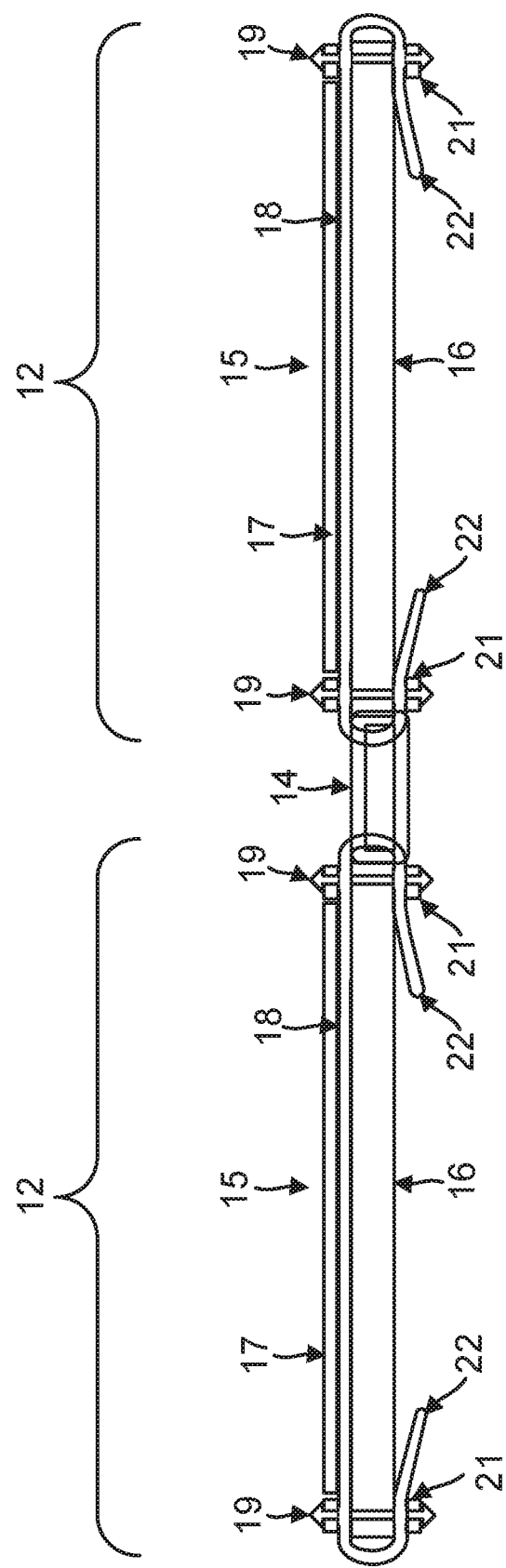

FIGS. 7A and 7B are cross-sectional side-view schematics of the solar panels 12, wherein FIG. 7A shows a pair of solar panels 12 that are connected by a hinge 14 and stacked together, and FIG. 6B shows the pair of solar panels 12 extended into position while connected to the hinge 14. Also shown are the SPM 15, solar cells 17, substrate 18, frame 16, fasteners 19, bars 21, and tabs 22.

The thickness of the stack formed by the pair of solar panels 12 comprises the thickness of each of the solar panels 12 panels and the spacing between them. One or more snubbers 24 may be positioned between the stacked solar panels 12, wherein the snubbers 26 are soft, shock absorbing materials such as foam that maintain pressure and contact between the solar panels 12 to minimize bow and vibration of the solar panels 12.

Figure 8A:
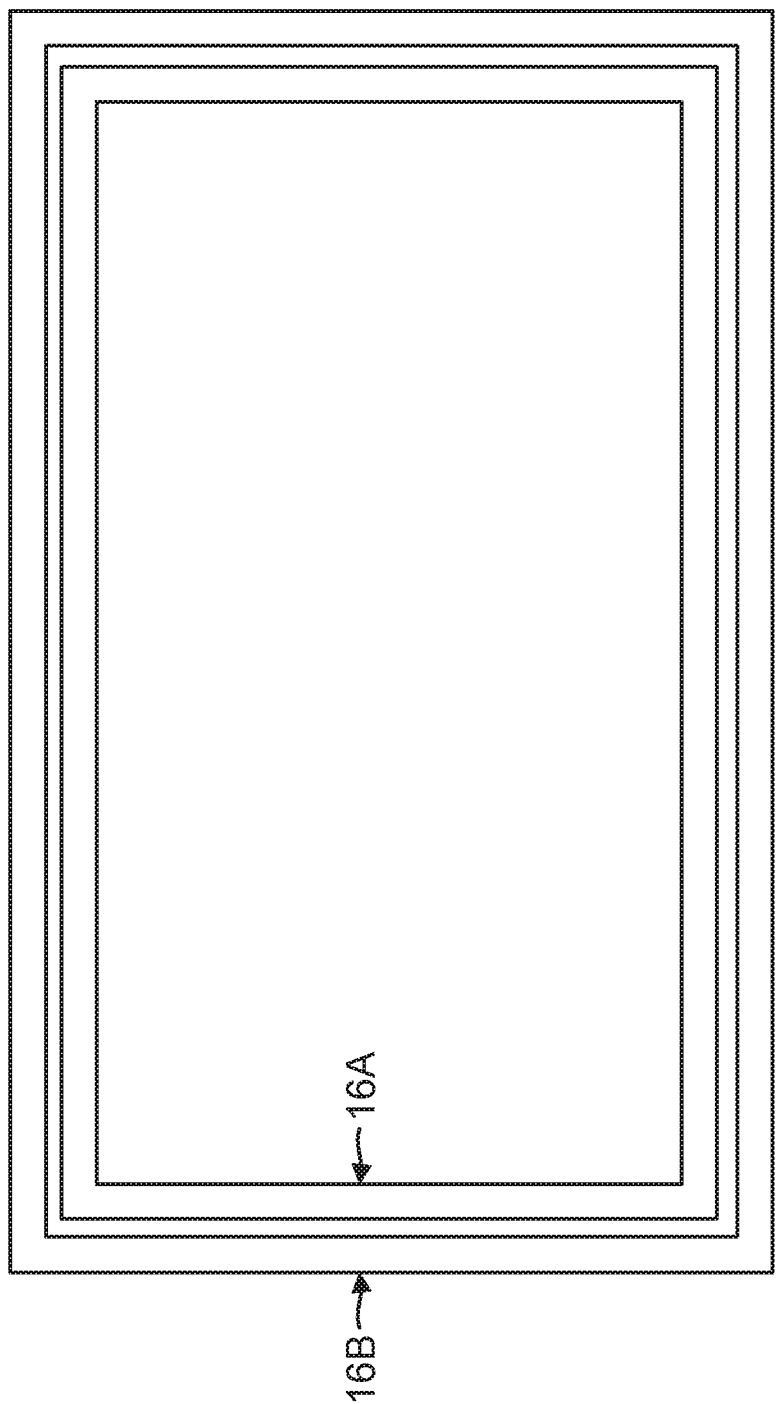

FIGS. 8A, 8B and 8C are top-view, cross-sectional side-view, and side-view schematics, respectively, illustrating another configuration for the solar panels 12. While the frames 16 in FIGS. 7A and 7B are the same size, in this example there are different sizes for the frames 16 that provide for a different stowed configuration. Specifically, a smaller one or more of the frames 16A can be stacked inside a larger one or more of the frames 16B, as shown in FIG. 8A, wherein each of the frames 16A, 16B have slightly different widths. FIG. 8B shows a cross-sectional side-view with the solar panels 12 stowed together in a stacked configuration, and FIG. 8C shows a side-view with the solar panels 12 deployed. In this example, the SPM 15, solar cells 17 and substrate 18 are positioned on the same side of the smaller frame 16A as compared to the SPM 15, solar cells 17 and substrate 18 on the larger frame 16B. Also shown is the hinge 14 connecting the solar panels 12, although the mechanism of the hinge 14 to accomplish the stacking and deployment of the solar panels 12 is not detailed here.

The retracted solar array 11 is given a specific volume to occupy in the spacecraft 10 design. The conventional folding in FIG. 7A apportions less than half the height of the space to each solar panel 12. The new design shown in FIG. 8B shows how both panels 12 can be more than half the height of the space. The new design allows the panels 12 to have a greater height within the allowed space. This increased height increases its stiffness resulting in a more stable spacecraft 10.

Figure 9B:
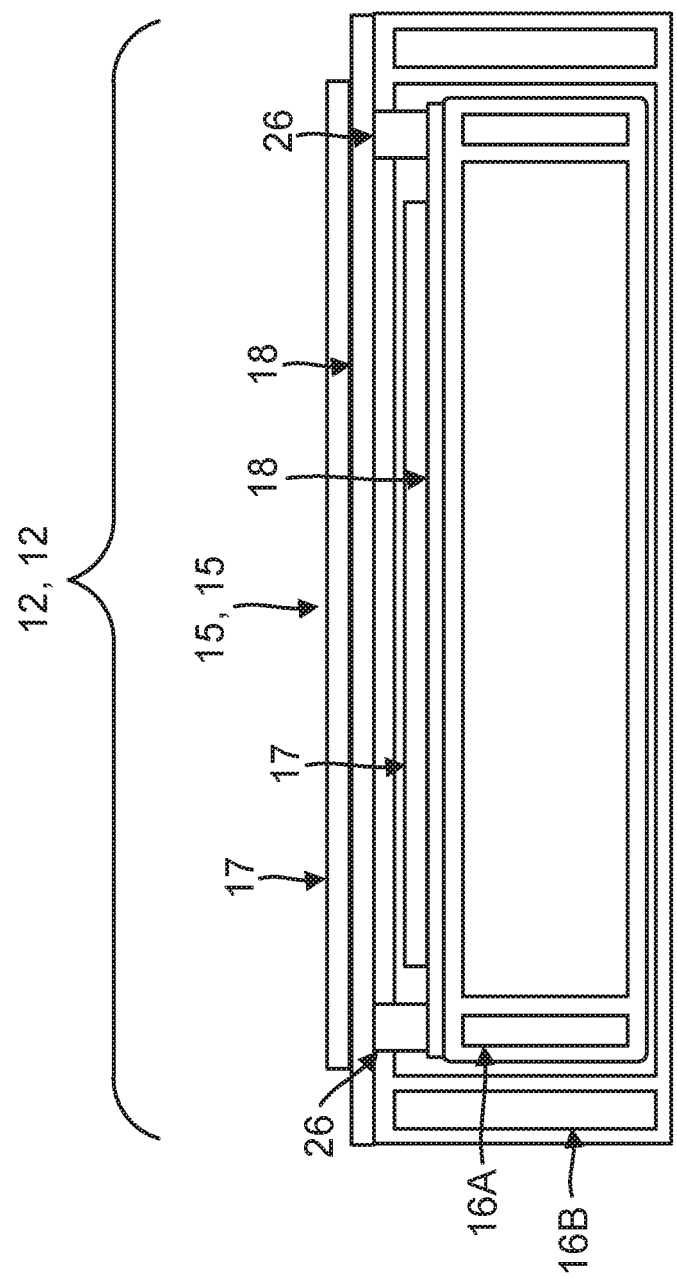

FIGS. 9A, 9B and 9C are top-view, cross-sectional side-view, and side-view schematics, respectively, illustrating yet another configuration for the solar panels 12. In this example, the SPM 15, solar cells 17 and substrate 18 are positioned on an opposite side of the smaller frame 16A as compared to the SPM 15, solar cells 17 and substrate 18 on the larger frame 16B. FIG. 9A is a top-view showing a smaller one or more of the frames 16A stacked inside a larger one or more of the frames 16B, wherein each of the frames 16A, 13B have slightly different widths. FIG. 9B is a cross-sectional side-view with the solar panels 12 stowed together in a stacked configuration, and FIG. 9C is a side-view with the solar panels 12 deployed.

As noted above, in this configuration the substrate 18 is on the opposite side of the smaller frame 16A, which is the side opposite the Sun. As shown in FIG. 9C, the solar cells 17 are inside the frame 16A facing the Sun when deployed. When stowed, as shown in FIG. 9B, the SPMs 15, solar cells 17 and substrates 18 of the respective solar panels 12 are positioned close together. The spacing and vibration can be controlled by one or more snubbers 26 or other mechanisms. This assembly is more rigid when stowed, and more robust against vibration and acoustic loads present during launch.

The smallest panel 12 may incorporate reinforcing materials 24 and/or supporting members (not shown) inside the frame 16A to increase stiffness, wherein the reinforcing materials 24 could be mesh, honeycomb material, or the like, and the supporting members could be various bars, channels, or the like.

Figure 10A:
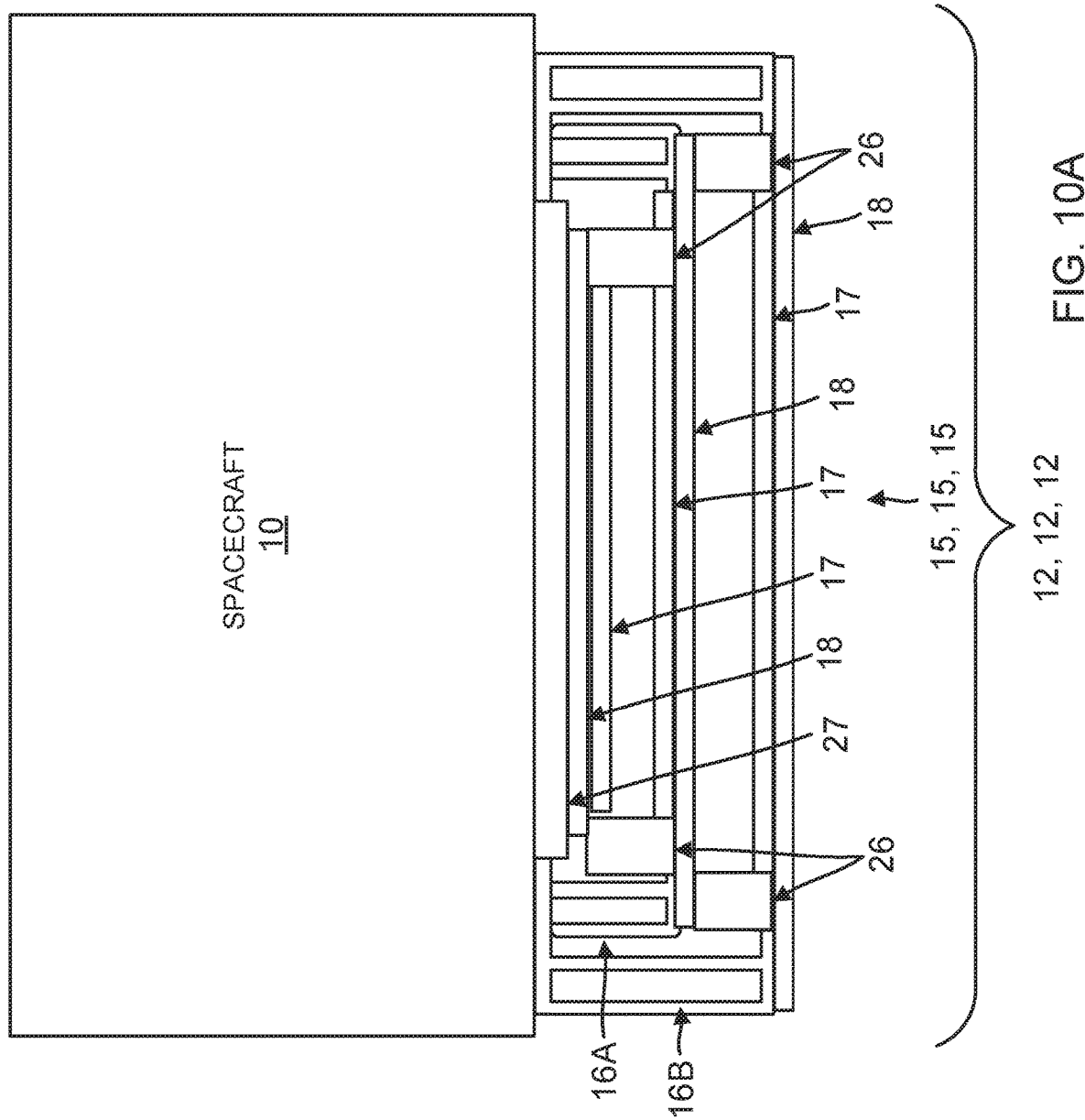

FIGS. 10A and 10B are cross-sectional side-view schematics illustrating yet another configuration involving solar panels 12 mounted on a spacecraft 10, wherein FIG. 10A is a cross-sectional side-view with the solar panels 12 stowed together in a stacked configuration, and FIG. 10B is a cross-sectional side-view with the solar panels 12 deployed.

In this example, a thin panel 27 is attached to a body of the spacecraft 10, as shown in FIG. 10B, and a solar panel 12 is attached to the thin panel 27. The other solar panels 12, which fold out when deployed, are stacked against the solar panel 12 attached to the thin panel 27 when stowed together. Thus, all of the solar panels 12 are stacked over the thin panel 27 and the body of the spacecraft 10 when stowed together. One or more snubbers 26 can be installed to protect the spacecraft 10 and solar panels 12 during launch. This stacked configuration provides a thicker structure, which increases the fundamental mode, thereby providing for a more stable spacecraft 10.

Functional Block Diagram

Figure 11:
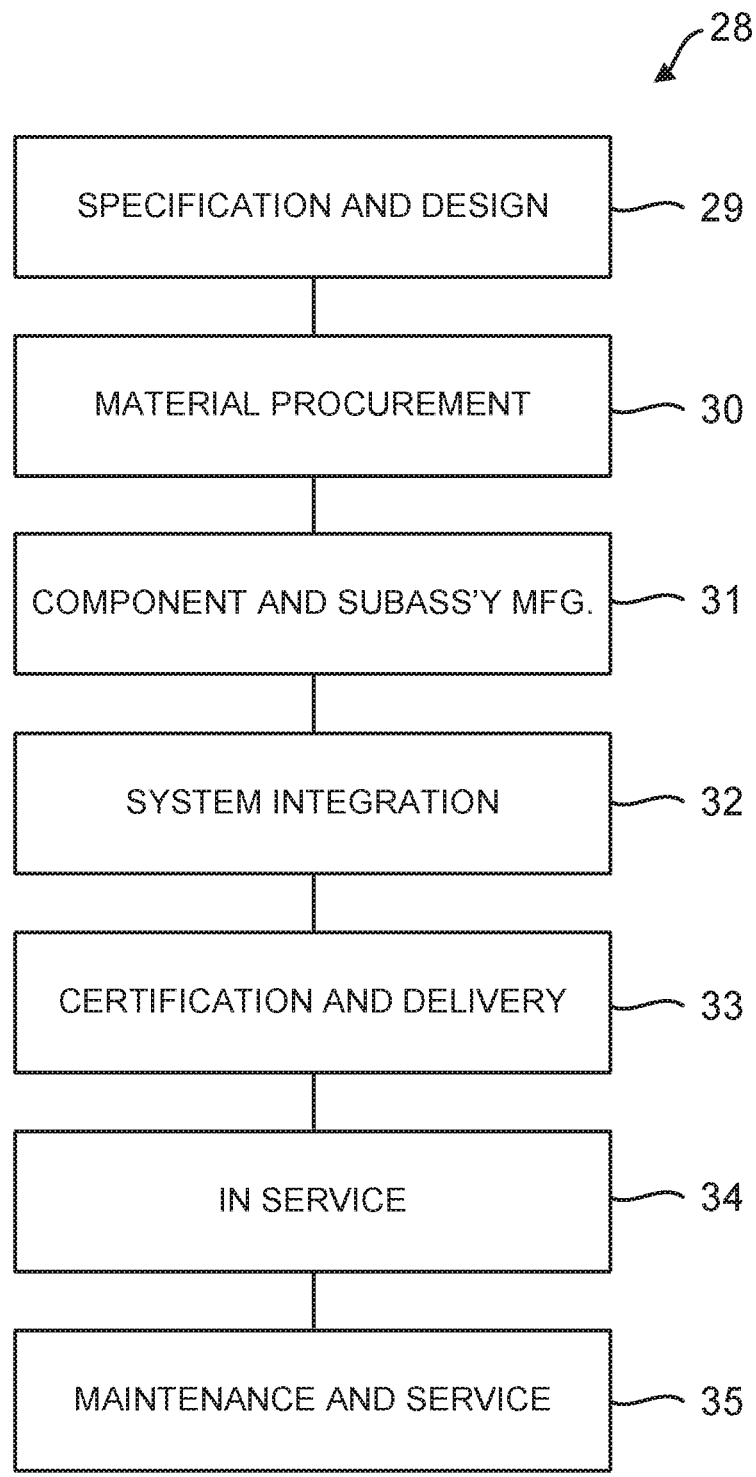
FIG. 11 illustrates a method of fabricating an apparatus comprising a solar array for a spacecraft.
Figure 12:
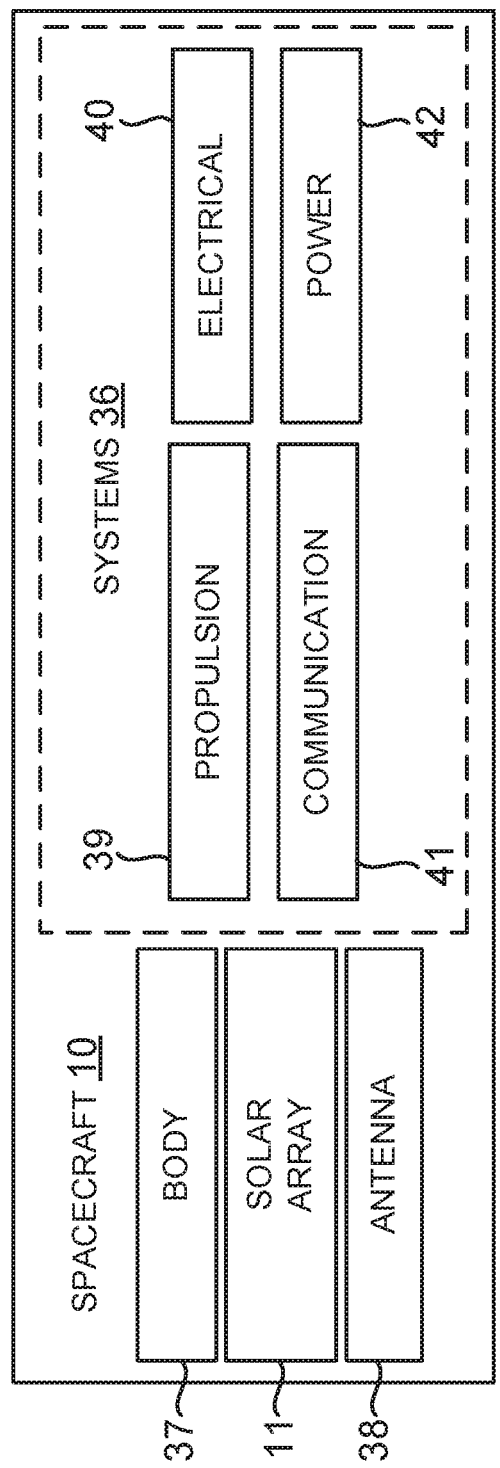
FIG. 12 illustrates the resulting apparatus comprising a spacecraft with a solar array.

Examples of the disclosure may be described in the context of a method 28 of fabricating an apparatus comprising the solar array 11 for the spacecraft 10, the method 28 comprising steps 29-35, as shown in FIG. 11, wherein the resulting spacecraft 10 having the solar array 11 is shown in FIG. 12.

As illustrated in FIG. 11, during pre-production, exemplary method 28 may include specification and design 29 of the spacecraft 10 and/or solar array 11, and material procurement 30 for same. During production, component and subassembly manufacturing 31 and system integration 32 of the spacecraft 10 and/or solar array 11 takes place, which include fabricating the spacecraft 10 and/or solar array 11, including bonding one or more solar cells 17 to the substrate 18, and then attaching the substrate 18 and the solar cells 17 to a frame 16 for support. Thereafter, the spacecraft 10 and/or solar array 11 may go through certification and delivery 33 in order to be placed in service 34. The spacecraft 10 and/or solar array 11 may also be scheduled for maintenance and service 35 (which includes modification, reconfiguration, refurbishment, and so on), before being launched.

Each of the processes of method 28 may be performed or carried out by a system integrator, a third party, and/or an operator (e.g., a customer). For the purposes of this description, a system integrator can include without limitation any number of solar cell 17, solar panel 12, solar array 11 or spacecraft 10 manufacturers and major-system subcontractors; a third party may include without limitation any number of venders, subcontractors, and suppliers; and an operator may be a satellite company, military entity, service organization, and so on.

As shown in FIG. 12, a spacecraft 10 fabricated by exemplary method 28 can include systems 36, a body 37, one or more solar arrays 11, and one or more antennae 38. Examples of the systems 36 included with the spacecraft 10 include, but are not limited to, one or more of a propulsion system 39, an electrical system 40, a communications system 41, and a power system 42. Any number of other systems 36 also may be included.

Figure 13:
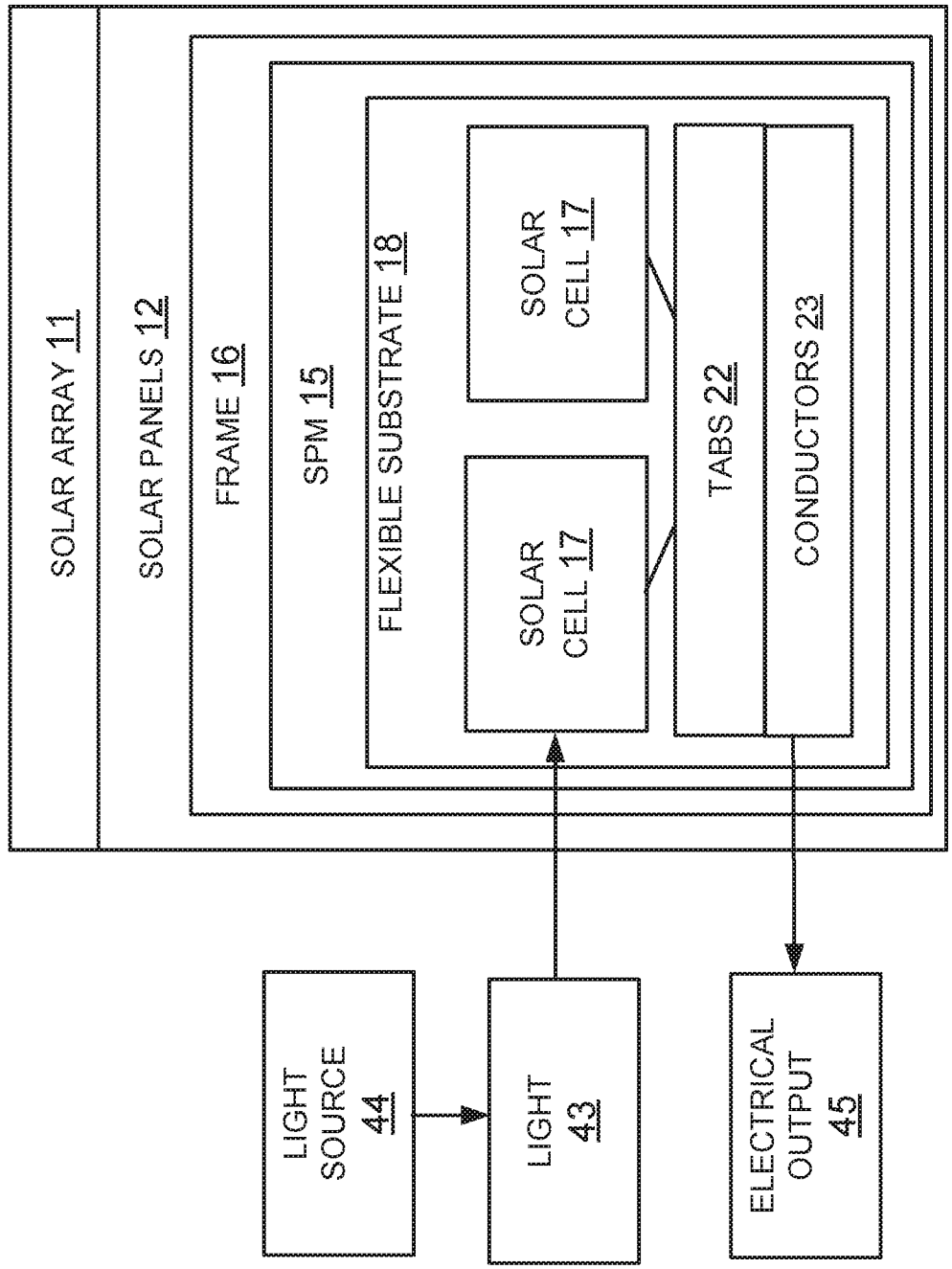
FIG. 13 is an illustration of a method of deploying and operating the solar array, in the form of a functional block diagram.

FIG. 13 is an illustration of a method of stowing, deploying and operating the solar array 11, in the form of a functional block diagram, according to one example.

When stowed and deployed, the solar array 11 is comprised of at least first and second solar panels 12, wherein each of the first and second solar panels 12 includes one or more of the SPMs 15 and each of the SPMs 15 is comprised of a substrate 18, which may be a flexible substrate 18, having one or more solar cells 17 bonded thereto; and a frame 16 for supporting the substrate 18 and the solar cells 17. The frame 16 has a cutout or opening under the solar cells 17 and, when deployed, the cutout or opening enables cooling of the solar cells 17 through the substrate 18 by exposing a back side of the substrate 18 for transferring or radiating heat directly through the cutout or opening of the frame 16. The frame 16 of the first solar panel 12 is configured to be nested inside the cutout or opening of the frame 16 of the second solar panel 12 when the first and second solar panels 12 are stowed in a stacked configuration.

When operating, each of the solar cells 17 absorbs light 43 from a light source 44 and generates an electrical output 45 in response thereto, which results in excess heat being generated by the solar cells 17.

The frame 16 of the first solar panel 12 may have a thickness different from the frame 16 of the second solar panel 12, to increase rigidity of the first solar panel 12 and the second solar panel 12 in the stacked configuration, while reducing weight and enabling efficient thermal dissipation when deployed for operation.

The first and second solar panels 12 may be connected by a hinge for stacking the first and second solar panels 12 together when stowed, and for extending the first and second solar panels 12 into position when deployed.

One or more snubbers 26 may be positioned between the spacecraft 10, first and second solar panels 12 when stowed in a stacked configuration.

The frames 16 for the first and second solar panels 12 may be different sizes, such that a smaller one of the frames 16 can be stacked inside a larger one of the frames 16 when stowed in a stacked configuration.

The substrate 18 and solar cells 17 for the first and second solar panels 12 may be positioned on a same side of the frames 16 for first and second solar panels 12, or the substrate 18 and solar cells 17 for the first and second solar panels 12 may be positioned on opposite sides of the frames 16 for first and second solar panels 12. The substrate 18 and solar cells 17 for the first and second solar panels 12 positioned on opposite sides of the frames 16 for first and second solar panels 12 may face a same direction when deployed. The substrate 18 and solar cells 17 for the first and second solar panels 12 positioned on opposite sides of the frames 16 for first and second solar panels 12 may be positioned adjacent each other when stowed.

The solar array 11 may include a third solar panel 12, wherein the third solar panel 12 is comprised of a substrate 18 having one or more solar cells 17 bonded thereto, and a frame 16 for supporting the substrate 18 and the solar cells 17; the third solar panel 12 is attached to a panel 25 on a body of a spacecraft 10; and the first and second solar panels 12 are stacked against the third solar panel 12 when stowed together.

CONCLUSION

The description of the examples set forth above has been presented for purposes of illustration and description, and is not intended to be exhaustive or limited to the examples described. Many alternatives, modifications and variations may be used in place of the specific elements described above.

What is claimed is:

1. An apparatus, comprising:
   at least first and second solar panels for a spacecraft, wherein:
   each of the first and second solar panels is comprised of a substrate having one or more solar cells bonded thereto, and a frame for supporting the substrate and the solar cells;
   the frame is a rectangular structure defining a perimeter around a cutout or opening in a center of the frame, and the substrate is attached to the frame at each side of the frame, only around the perimeter of the frame, and along one or more edges of the substrate, such that, when deployed from the spacecraft, the cutout or opening enables cooling of the solar cells through the substrate by exposing a back side of the substrate and the solar cells for transferring or radiating heat directly through the cutout or opening of the frame; and
   the frame of the first solar panel is configured to be nested inside the cutout or opening of the frame of the second solar panel when the first and second solar panels are stowed in a stacked configuration in the spacecraft.

2. The apparatus of claim 1, wherein the substrate is a flexible substrate.

3. The apparatus of claim 1, wherein the frame of the first solar panel has a thickness different from the frame of the second solar panel, to increase rigidity of the first solar panel and the second solar panel in the stacked configuration, while reducing weight and enabling efficient thermal dissipation when deployed for operation.

4. The apparatus of claim 1, wherein the first and second solar panels are connected by a hinge for stacking the first and second solar panels together when stowed, and for extending the first and second solar panels into position when deployed.

5. The apparatus of claim 1, further comprising one or more snubbers positioned between the spacecraft, first and second solar panels when stowed in the stacked configuration.

6. The apparatus of claim 1, wherein the frames for the first and second solar panels are different sizes, such that a smaller one of the frames can be stacked inside a larger one of the frames when stowed in a stacked configuration.

7. The apparatus of claim 1, wherein the substrate and the solar cells for the first and second solar panels are positioned on a same side of the frames for first and second solar panels.

8. The apparatus of claim 1, wherein the substrate and the solar cells for the first and second solar panels are positioned on opposite sides of the frames for the first and second solar panels.

9. The apparatus of claim 8, wherein the substrate and the solar cells for the first and second solar panels positioned on opposite sides of the frames for the first and second solar panels face a same direction when deployed.

10. The apparatus of claim 8, wherein the substrate and the solar cells for the first and second solar panels positioned on opposite sides of the frames for the first and second solar panels are positioned adjacent each other when stowed.

11. The apparatus of claim 1, further comprising:
    a third solar panel, wherein:
    the third solar panel is comprised of a substrate having one or more solar cells bonded thereto;
    the third solar panel is attached to a panel on a body of a spacecraft; and
    the first and second solar panels are stacked against the third solar panel when stowed together.

12. A method, comprising:
    stowing at least first and second solar panels for a spacecraft, wherein:
    each of the first and second solar panels is comprised of a substrate having one or more solar cells bonded thereto, and a frame for supporting the substrate and the solar cells;
    the frame is a rectangular structure defining a perimeter around a cutout or opening in a center of the frame, and the substrate is attached to the frame at each side of the frame, only around the perimeter of the frame, and along one or more edges of the substrate, such that, when deployed from the spacecraft, the cutout or opening enables cooling of the solar cells through the substrate by exposing a back side of the substrate and the solar cells for transferring or radiating heat directly through the cutout or opening of the frame; and
    the frame of the first solar panel is configured to be nested inside the cutout or opening of the frame of the second solar panel when the first and second solar panels are stowed in a stacked configuration in the spacecraft.

13. The method of claim 12, wherein the substrate is a flexible substrate.

14. The method of claim 12, wherein the frame of the first solar panel has a thickness different from the frame of the second solar panel, to increase rigidity of the first solar panel and the second solar panel in the stacked configuration, while reducing weight and enabling efficient thermal dissipation when deployed for operation.

15. The method of claim 12, wherein the first and second solar panels are connected by a hinge for stacking the first and second solar panels together when stowed, and for extending the first and second solar panels into position when deployed.

16. The method of claim 12, further comprising positioning one or more snubbers between the spacecraft, first and second solar panels when stowed in the stacked configuration.

17. The method of claim 12, wherein the frames for the first and second solar panels are different sizes, such that a smaller one of the frames can be stacked inside a larger one of the frames when stowed in a stacked configuration.

18. The method of claim 12, wherein the substrate and the solar cells for the first and second solar panels are positioned on a same side of the frames for first and second solar panels.

19. The method of claim 12, wherein the substrate and the solar cells for the first and second solar panels are positioned on opposite sides of the frames for the first and second solar panels.

20. The method of claim 19, wherein the substrate and the solar cells for the first and second solar panels positioned on the opposite sides of the frames for the first and second solar panels face a same direction when deployed.

21. The method of claim 19, wherein the substrate and the solar cells for the first and second solar panels positioned on opposite sides of the frames for the first and second solar panels are positioned adjacent each other when stowed.

22. The method of claim 12, further comprising:
a third solar panel, wherein:
the third solar panel is comprised of a substrate having one or more solar cells bonded thereto;
the third solar panel is attached to a panel on a body of a spacecraft; and
the first and second solar panels are stacked against the third solar panel when stowed together.

23. A method, comprising:
deploying at least first and second solar panels for a spacecraft, wherein:
each of the first and second solar panels is comprised of a substrate having one or more solar cells bonded thereto, and a frame for supporting the substrate and the solar cells;
the frame is a rectangular structure defining a perimeter around a cutout or opening in a center of the frame, and the substrate is attached to the frame at each side of the frame, only around the perimeter of the frame, and along one or more edges of the substrate, such that, when deployed from the spacecraft, the cutout or opening enables cooling of the solar cells through the substrate by exposing a back side of the substrate and the solar cells for transferring or radiating heat directly through the cutout or opening of the frame; and
the frame of the first solar panel is configured to be nested inside the cutout or opening of the frame of the second solar panel when the first and second solar panels are stowed in a stacked configuration in the spacecraft.

* * * * *